(12) United States Patent
Tsujita

(10) Patent No.: US 10,269,275 B2
(45) Date of Patent: Apr. 23, 2019

(54) DISPLAY PANEL INSPECTING METHOD AND DISPLAY PANEL FABRICATING METHOD

(71) Applicant: JOLED INC., Tokyo (JP)

(72) Inventor: Yoshiki Tsujita, Kanagawa (JP)

(73) Assignee: JOLED INC., Tokyo (JP)

(*) Notice: Subject to any disclaimer, the term of this patent is extended or adjusted under 35 U.S.C. 154(b) by 263 days.

(21) Appl. No.: 15/106,472

(22) PCT Filed: May 22, 2015

(86) PCT No.: PCT/JP2015/002587
§ 371 (c)(1),
(2) Date: Jun. 20, 2016

(87) PCT Pub. No.: WO2015/190043
PCT Pub. Date: Dec. 17, 2015

(65) Prior Publication Data
US 2016/0343278 A1    Nov. 24, 2016

(30) Foreign Application Priority Data

Jun. 13, 2014   (JP) .................................. 2014-122873

(51) Int. Cl.
*G09G 3/00* (2006.01)
*H01L 27/00* (2006.01)
(Continued)

(52) U.S. Cl.
CPC ........... *G09G 3/006* (2013.01); *G09G 3/3233* (2013.01); *G09G 3/3258* (2013.01);
(Continued)

(58) Field of Classification Search
CPC .................................................... G09G 3/006
See application file for complete search history.

(56) References Cited

U.S. PATENT DOCUMENTS

2007/0063727 A1    3/2007   Miyake
2008/0055211 A1    3/2008   Ogawa
(Continued)

FOREIGN PATENT DOCUMENTS

JP   2007-085782   4/2007
JP   2008-052111   3/2008
(Continued)

OTHER PUBLICATIONS

International Search Report, issued by Japan Patent Office dated Jul. 14, 2015, in International Application No. PCT/JP2015/002587.

*Primary Examiner* — Amr A Awad
*Assistant Examiner* — Maheen I Javed
(74) *Attorney, Agent, or Firm* — Greenblum & Bernstein, P.L.C.

(57) ABSTRACT

A method for inspecting a display panel in which pixels each including a drive transistor that passes a drive current when signal voltage is applied to the gate of the drive transistor, and a light-emitting element that emits light according to the flow of the drive current are arranged in rows and columns, includes: applying, across the gate and the source of the drive transistor, an initialization voltage less than or equal to the threshold voltage of the drive transistor; applying a power supply voltage to the drain of the drive transistor to which the initialization voltage is applied across the gate and the source; and determining, as a defective pixel with a current leak, a pixel having a light-emitting element that does not emit light when the power supply voltage is applied to the drain of the drive transistor and emits light after the elapse of a predetermined period.

10 Claims, 27 Drawing Sheets

(51) Int. Cl.
*G09G 3/3233* (2016.01)
*G09G 3/3258* (2016.01)
*G09G 3/3266* (2016.01)
*G09G 3/3275* (2016.01)
*H01L 51/50* (2006.01)

(52) U.S. Cl.
CPC ......... *G09G 3/3266* (2013.01); *G09G 3/3275* (2013.01); *H01L 27/00* (2013.01); *H01L 51/50* (2013.01); *G09G 2310/0262* (2013.01); *G09G 2320/029* (2013.01); *G09G 2320/0214* (2013.01); *G09G 2320/043* (2013.01)

(56) References Cited

U.S. PATENT DOCUMENTS

| | | | |
|---|---|---|---|
| 2012/0306939 A1* | 12/2012 | Choi | G09G 3/006 345/690 |
| 2013/0044937 A1 | 2/2013 | Hiraoka | |
| 2014/0361961 A1 | 12/2014 | Takahara | |
| 2015/0145850 A1* | 5/2015 | Rohatgi | G09G 3/3233 345/212 |

FOREIGN PATENT DOCUMENTS

| | | |
|---|---|---|
| JP | 2008-064806 | 3/2008 |
| WO | 2011/135823 | 11/2011 |
| WO | 2013/118219 | 8/2013 |

* cited by examiner

DISPLAY PANEL INSPECTING METHOD AND DISPLAY PANEL FABRICATING METHOD

TECHNICAL FIELD

The present disclosure relates to display panel inspecting methods and display panel fabricating methods, and particularly relates to a method of inspecting for a leak defect in a transistor included in a pixel circuit.

BACKGROUND ART

Organic EL display panels using organic EL elements are known as display panels which use current-driven light-emitting elements. Such organic EL display panels have gained much attention as candidates for next-generation flat panel displays (FPDs) because of such advantages as excellent viewing angle characteristics and low power consumption.

In an active-matrix organic EL display panel, pixels including organic EL elements are two-dimensionally arranged. A pixel circuit included in each of the pixels includes, for example, a thin-film transistor (TFT) provided at a crosspoint between a scanning line and a data line. The gate of a drive transistor is connected to the TFT, and by turning ON the TFT through a selected scanning line, a data signal is input from the data line to the drive transistor, and the organic EL element emits light.

In the above-described pixel configuration, miniaturization of circuit elements is advancing in response to increases in screen size and level of high-definition of display panels. As the miniaturization of circuit elements advances, circuit element inspecting techniques for ensuring the performance of the respective transistors and organic EL elements become increasingly important.

Patent Literature 1 discloses a method for inspecting a TFT substrate of a display device in a short time and with high precision. Specifically, an inspecting TFT, which has one of a source and a drain electrically connected to the drain of a drive TFT, and the other electrically connected to a signal line in an adjacent column, and a gate connected to the scanning line in the next row, inspects the output current of the drive TFT via the signal line in the adjacent column. Accordingly, since detection of the pixel current passed by the drive TFT and signal writing to the next row or the next column can be carried out in parallel, inspection time can be shortened.

CITATION LIST

Patent Literature

[PTL 1] Japanese Unexamined Patent Application Publication No. 2008-52111

SUMMARY OF INVENTION

Technical Problem

However, in the display device inspecting method disclosed in Patent Literature 1, in the inspection process prior to shipment, pixel current is measured within one horizontal period of a frame period (60 Hz or 120 Hz), to correspond to the row-by-row scanning in performing a writing operation and a light-emitting operation. As such, it is difficult to detect a defective circuit element which changes over time due to a minute leakage current, and thus a display panel having pixels that could become bright spot-defective or black dot-defective after shipment could be released into circulation.

The present invention is conceived in view of the aforementioned problem and has as an object to provide a display panel inspecting method and a display panel fabricating method for precisely inspecting a circuit element which changes over time due to a minute leakage current.

Solution to Problem

In order to solve the aforementioned problem, a display panel inspecting method according to an aspect of the present invention is a method for inspecting a display panel in which pixels are arranged in rows and columns, the pixels each including: a drive transistor that passes a drive current when a signal voltage reflecting an image signal is applied to a gate of the drive transistor, the drive current corresponding to the signal voltage; a light-emitting element that emits light when the drive current flows through the light-emitting element, the light having a brightness corresponding to the drive current; and a switch transistor having a source and a drain, one of which is connected to the gate of the drive transistor, the display panel inspecting method comprising: (A) applying an initialization voltage across the gate and a source of the drive transistor, the initialization voltage being less than or equal to a threshold voltage of the drive transistor; (B) applying a power supply voltage for generating the drive current to one of the source and a drain of the drive transistor in a state where the initialization voltage is applied across the gate and the source of the drive transistor, or applying an inspecting voltage to the other of the source and the drain of the switch transistor or the gate of the switch transistor, the inspecting voltage, when applied to the gate of the drive transistor, causing a gate-source voltage of the drive transistor to be greater than or equal to the threshold voltage; and (C) determining, as being a defective pixel with a current leak, a pixel, among the pixels, which has the light-emitting element that does not emit light at a moment when step (B) is executed and emits light after an elapse of a predetermined period from the moment.

Advantageous Effects of Invention

The display panel inspecting method according to the present invention allows precise inspection of a circuit element which changes over time due to a minute leakage current. Therefore, it is possible to prevent a display panel having pixels that could become bright spot-defective or black dot-defective after shipment from being released into circulation.

DESCRIPTION OF EMBODIMENTS

Hereinafter, embodiments of a display panel inspecting method and a display panel fabricating method will be described using the drawings. It should be noted that each of the subsequently-described embodiments show a specific preferred example of the present disclosure. Therefore, numerical values, shapes, materials, structural components, the arrangement and connection of the structural components, steps, the sequence of the steps, etc., shown in the following embodiments are mere examples, and are not intended to limit the scope of the present invention. Therefore, among the structural components in the subsequent embodiments, components not recited in any one of the independent claims which indicate the broadest concepts of the present invention are described as arbitrary structural components.

It should be noted that the respective figures are schematic diagrams and are not necessarily precise illustrations. Furthermore, in the respective figures, the same reference sign is given to substantially identical components, and overlapping description is omitted or simplified.

Embodiment 1

Hereinafter, a display panel inspecting apparatus, a display panel inspecting method, and a display device fabricating method according to Embodiment 1 will be described with reference to the Drawings.

(1. Display Panel Inspecting Apparatus Configuration)

Figure 1:
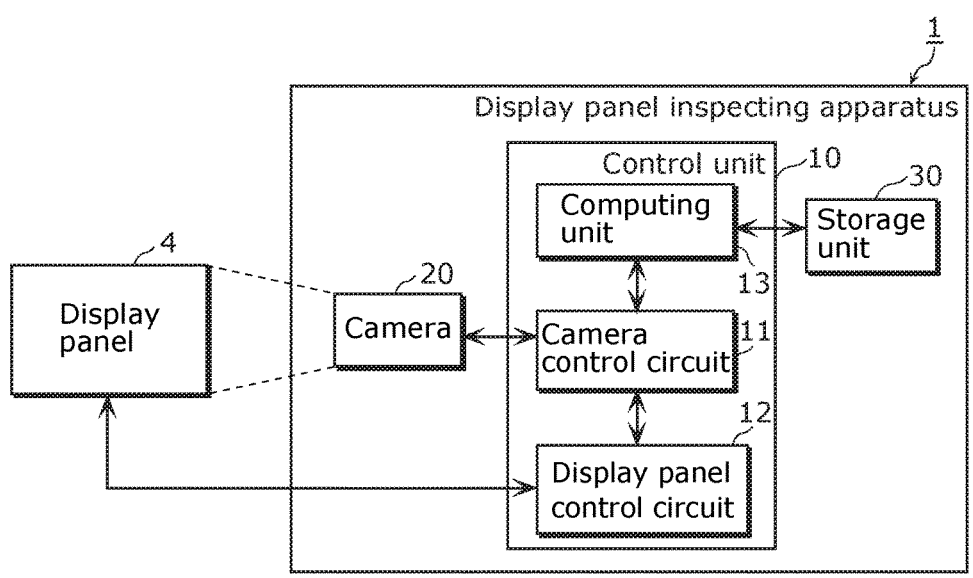
FIG. 1 is a block diagram illustrating a configuration of an inspecting system including a display panel inspecting apparatus according to Embodiment 1.

FIG. 1 is a block diagram illustrating a configuration of an inspecting system including a display panel inspecting apparatus according to Embodiment 1. The inspecting system in the figure includes a display panel 4 which is the object to be inspected, and a display panel inspecting apparatus 1. The display panel inspecting apparatus 1 is a device that inspects for current leak defects in pixels which are arranged in rows and columns in the display panel 4, and includes a control unit 10, a camera 20, and a storage unit 30. The control unit 10 includes a camera control circuit 11, a display panel control circuit 12, and a computing unit 13.

The camera 20 is, for example, a charge coupled device (CCD) camera, and is an imaging device which captures images of the display panel 4. The camera 20 has an imaging area in which imaging elements are arranged in rows and columns, and includes an imaging lens which condenses incident light onto the imaging elements, and a shutter which determines the passage and blockage of incident light to the imaging lens. According to the above-described configuration, in the camera 20, light emitted from the pixels arranged in rows and columns in the display panel 4 enter the imaging area via the imaging lens. Each of the imaging elements converts incident light into an amount of charge corresponding to the amount of light of the incident light. It should be noted that the positions of the display panel 4 and the camera 20 are adjusted so that the center axis of the display panel 4 and the center axis of the imaging lens coincide. Accordingly, for example, an imaging element disposed in the center portion of the imaging area receives the emitted light from a pixel disposed in the center portion of the display panel 4, and generates an amount of charge corresponding to the emitted light. An imaging element disposed in the outer circumferential portion of the imaging area receives the emitted light from a pixel disposed in the outer circumferential portion of the display panel 4, and generates an amount of charge corresponding to the emitted light.

The camera control circuit 11 is a camera control unit which causes the shutter of the camera 20 to open and close.

The display panel control circuit 12 drives a scanning line drive circuit 42 and a data line drive circuit 42 included in the display panel 4, and executes operation control of the circuit elements included in the pixels.

The computing unit 13 calculates the luminance value of each of the pixels at a certain time, from image data captured by the camera 20.

The storage unit 30 is a memory for storing luminosity data of each pixel calculated by the computing unit 13. It should be noted that the storage unit 30 may be a memory provided inside the control unit 10.

It should be noted that, although the camera 20 is used for detecting light-up and light-out of the respective pixels in this embodiment, the light-up and light-out of the respective pixels may be verified by luminance measurement by a luminance meter other than a camera or by visual confirmation.

(2. Display Panel Configuration)

Here, a configuration of the display panel 4 which is the object to be inspected will be described.

Figure 2:
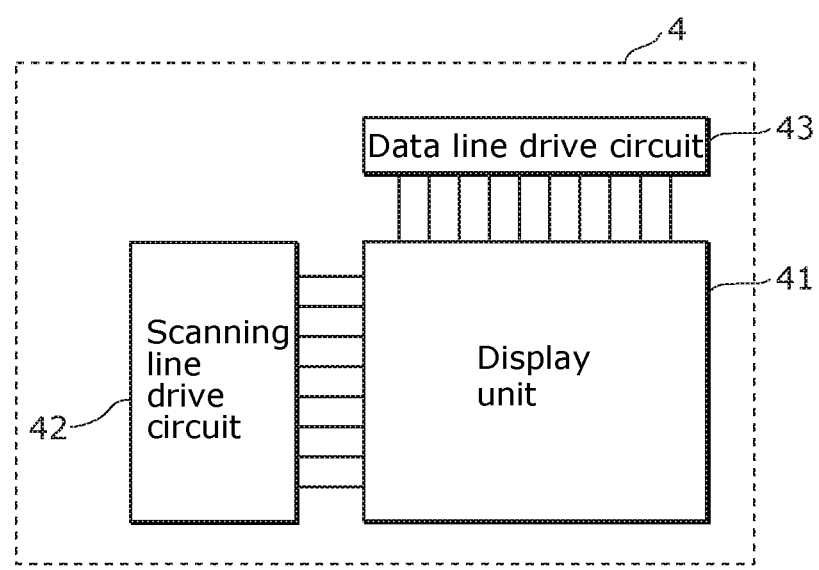
FIG. 2 is a block diagram illustrating a configuration of a display panel.

FIG. 2 is a block diagram illustrating a configuration of a display panel. A display panel 4 includes a display unit 41, the scanning line drive circuit 42, and the data line drive circuit 43.

The display unit 41 is a display area in which pixels, each including an organic EL element and a drive element which drives the organic EL element, are arranged in rows and columns.

The scanning line drive circuit 42 selects, via scanning lines disposed on a per pixel row basis, a pixel row on which writing of signal voltage corresponding to gradation data is to be performed.

The data line drive circuit 43 outputs, via data lines disposed on a per pixel column basis, data voltage to pixels belonging to the selected pixel row.

Figure 3:
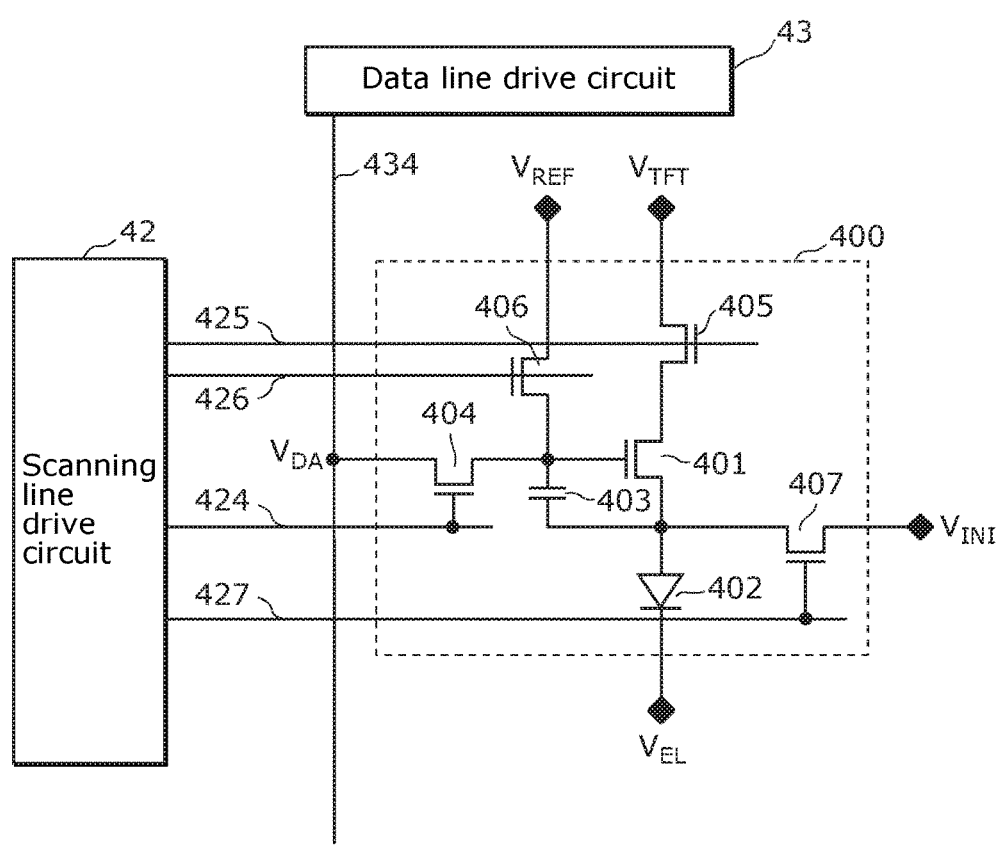
FIG. 3 is a diagram illustrating an example of the circuit configuration of a pixel and the connection with peripheral circuits.

FIG. 3 is a diagram illustrating an example of the circuit configuration of a pixel and the connection with peripheral circuits. A pixel 400 in the figure includes scanning lines 424 to 427, a data line 434, a drive transistor 401, an organic EL element 402, a holding capacitor element 403, a selection transistor 404, an enable transistor 405, a reference transistor 406, and an initialization transistor 407. Furthermore, the peripheral circuits include the scanning line drive circuit 42 and the data line drive circuit 43.

The scanning line drive circuit 42 is connected to the scanning lines 424 to 427, and controls the conduction and non-conduction of the selection transistor 404, the enable transistor 405, the reference transistor 406, and the initialization transistor 407.

The data line drive circuit 43 is connected to the data line 434, and determines the drive current that flows to the drive transistor 401 by outputting a signal voltage reflecting a video signal.

The drive transistor 401 has a gate connected to data line 434 via the selection transistor 404, a source connected to an anode of the organic EL element 402, and a drain connected to a positive power supply line ($V_{TFT}$) via the enable transistor 405. With this, the drive transistor 401 converts the signal voltage into a drive current corresponding to the signal voltage, and supplies the drive current obtained from the conversion to the organic EL element 402.

The organic EL element 402 functions as a current-driven light-emitting element, and a cathode of the organic EL element 402 is connected to a negative power supply line ($V_{EL}$).

The holding capacitor element 403 is connected to the gate and source of the drive transistor 401. The holding capacitor element 403 has, for example, a function of maintaining the immediately-preceding gate-source voltage even after the selection transistor 404 turns OFF, and causing drive current to be supplied continuously from the drive transistor 401 to the organic EL element 402.

The selection transistor 404 is a switch transistor which has a gate connected to the scanning line 424 and controls the timing for supplying the signal voltage of the data line 434 to the gate of the drive transistor 401.

The enable transistor 405 is a light-emission transistor which has a gate connected to the scanning line 425 and controls the timing for supplying a power supply voltage $V_{TFT}$ of the positive power supply line to the drain of the drive transistor 401.

The reference transistor 406 is a switch transistor which has a gate connected to the scanning line 426 and controls the timing for supplying a reference voltage $V_{REF}$ of a reference power supply line provided for detecting a threshold voltage to the gate of the drive transistor 401.

The initialization transistor 407 has a gate connected to scanning line 427, and controls the timing for supplying an initialization voltage $V_{INI}$ of an initialization power supply line to the source of the drive transistor 401.

It should be noted that, although not illustrated in FIG. 3, the positive power supply line is connected to a power supply. Furthermore, the negative power supply line is connected to a different power supply and is grounded.

Next, a driving sequence of the pixel circuit illustrated in FIG. 3 is described.

(2-1. Initialization Period)

Only the initialization transistor 407 is placed in the conducting state, and the source potential of the drive transistor 401 is set to the initialization voltage $V_{INI}$. It should be noted that the initialization voltage $V_{INI}$ is, for example, −3 V.

(2-2. Threshold Voltage Detection Period)

The reference transistor 406 is placed in the conducting state. Accordingly, the differential voltage between the reference voltage $V_{REF}$ and the initialization voltage $V_{INI}$ is charged to the holding capacitor element 403. It should be noted that the reference voltage $V_{REF}$ is, for example, 3 V.

Next, the initialization transistor 407 is placed in the non-conducting state, the reference transistor 406 is kept in the conducting state, and the enable transistor 405 is placed in the conducting state. At this time, the voltage setting in the initialization period causes drain current to flow in the state where current does not flow in the organic EL element 402, and thus the source potential of the drive transistor 401 changes. Then, the potential difference (i.e., the gate-source voltage of the drive transistor 401) between both electrodes of the holding capacitor element 403 becomes a potential difference equivalent to the threshold voltage Vth of the drive transistor 401.

Next, the enable transistor 405 is placed in the non-conducting state. Accordingly, the supply of drain current stops, and the threshold voltage detection operation concludes. It should be noted that the power supply voltage $V_{TFT}$ is, for example, 17.7 V, and a cathode voltage $V_{EL}$ of the organic EL element is, for example, 1.3 V.

(2-3. Writing Period)

Preparation for the writing operation is carried out by placing the reference transistor 406 in the non-conducting state and placing the selection transistor 404 in the conducting state.

In this state, a data line voltage $V_{DA}$, which is a signal voltage, is applied to a first electrode of the holding capacitor element 403 via the data line 434. Accordingly, a voltage obtained by adding a voltage corresponding to the voltage difference between the data line voltage $V_{DA}$ and the reference voltage $V_{REF}$ to the threshold voltage Vth of the drive transistor 401 held in the threshold voltage detection period is stored (held) in the holding capacitor element 403. It should be noted that the data line voltage $V_{DA}$ changes according to the gradation data, and the data line voltage $V_{DA}$ (L) in the case of black display in which the organic EL element 402 is not allowed to emit light is, for example, 0 V.

(2-4. Light-Emitting Period)

The selection transistor 404, the reference transistor 406, and the initialization transistor 407 are placed in the non-conducting state, and the enable transistor 405 is placed in the conducting state. Accordingly, drive current flows to the organic EL element 402 according to the voltage accumulated in the holding capacitor element 403, and the organic EL element 402 emits light in accordance with the drive current.

(3. Display Panel Fabricating Method)

Figure 4:
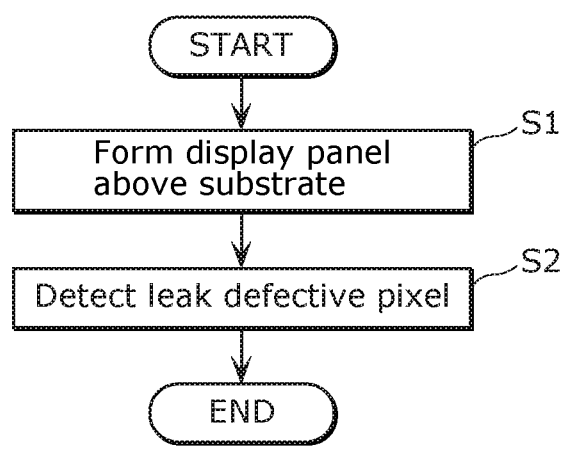
FIG. 4 is an operation flowchart illustrating a display panel fabricating method according to the present disclosure.

FIG. 4 is an operation flowchart illustrating a display panel fabricating method according to the present disclosure. A method of fabricating the display panel 4 according to the present disclosure includes a process of forming the display panel 4 and a process of detecting a leak-defective pixel.

First, the display panel 4 is formed on a display panel substrate (S1). Specifically, a drive circuit layer is formed in which, for example, the drive transistor 401, the holding capacitor element 403, the selection transistor 404, the enable transistor 405, the reference transistor 406, the initialization transistor 407, the data line 434, and the scanning lines 424 to 427 illustrated in FIG. 3 are arranged as appropriate. Next, a light-emitting layer including the organic EL element 402 is formed above the drive circuit layer, after a planarizing process is performed on the drive circuit layer. The light-emitting layer includes, for example, an anode, a hole injection layer, a hole transport layer, an organic light-emitting layer, a bank layer, an electron injection layer, and a transparent cathode.

Next, a leak-defective pixel is detected (S2). Hereinafter, step S2 which is the main part of the display panel fabricating method according to the present disclosure will be described in detail as a method of inspecting the display panel 4.

(4. Display Panel Inspecting Method)

In the case where any of the respective transistors included in the pixel circuit has a short-circuit defect between the source, drain, and gate, the pixel including the transistor with the short-circuit defect becomes a bright spot pixel or a black dot pixel at the moment when power supply voltage is applied to the drain of the drive transistor or at the moment when a predetermined voltage is applied to a peripheral transistor connected to the gate of the drive transistor in the state where the power supply voltage is applied to the drain of the drive transistor. In order to detect this bright spot pixel or black dot pixel, in the light-up inspection in the conventional fabricating process, a defective pixel is detected by measuring the brightness of each pixel based on image data captured during a light-up period of approximately one frame period (60 Hz or 120 Hz) or one horizontal period. However, in the image display drive sequence described above, detecting a pixel that becomes defective over time due to a transistor having a minute leakage current flowing is difficult. In other words, a display panel having a pixel that was determined to be a normal pixel in the light-up inspection in the aforementioned sequence in the fabricating process but becomes bright spot-defective or black dot-defective after shipment, could be released into circulation.

In contrast, in the display panel inspecting method in this embodiment, each of the transistors which change over time due to minute leakage current can be inspected with high precision at a fabricating stage prior to shipment.

Hereinafter, the display panel inspecting method according to this embodiment will be described using FIG. 5 to FIG. 8.

Figure 5:
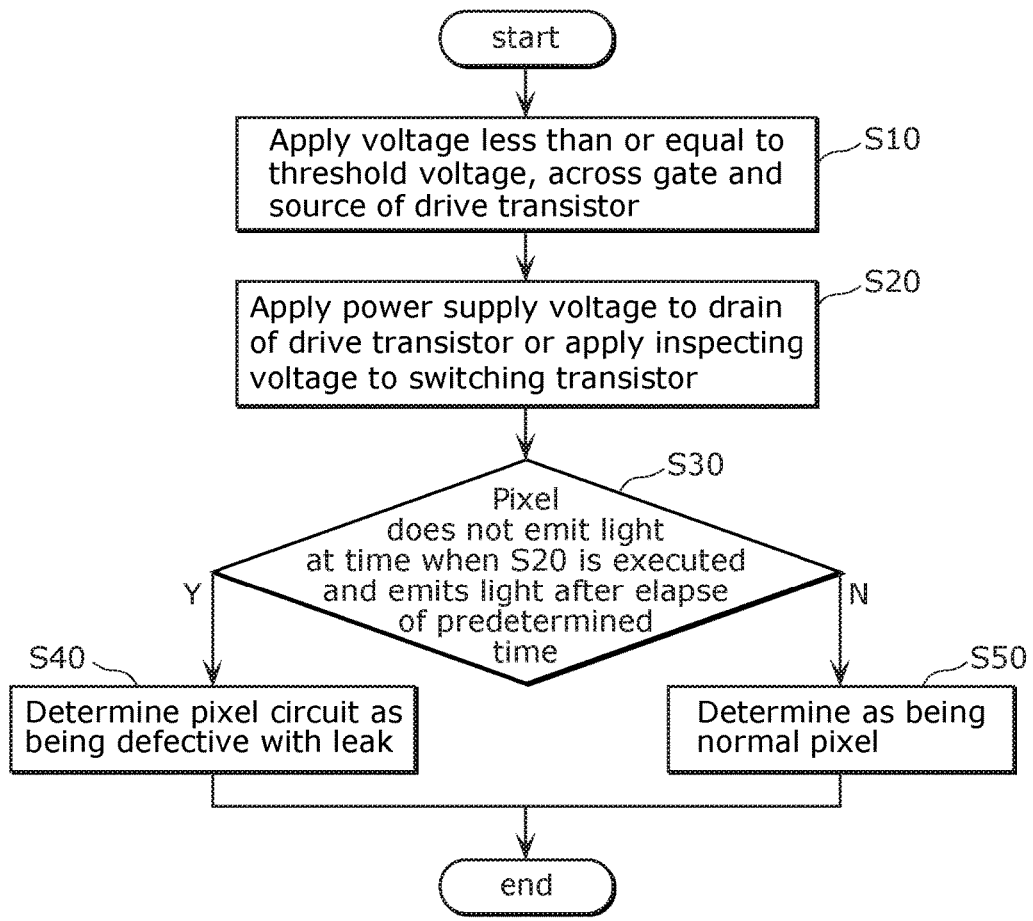
FIG. 5 is an operational flowchart describing the display panel inspecting method in the present disclosure.

FIG. 5 is an operational flowchart describing the display panel inspecting method in the present disclosure.

First, the display panel control circuit 12 places the selection transistor 404 in the conducting state to apply a predetermined voltage from the data line 434 to the first electrode of the holding capacitor element 403. Furthermore, the display panel control circuit 12 places the initialization transistor 407 in the conductive state to apply the initialization voltage $V_{INI}$ from the initialization power supply line to the second electrode of the holding capacitor element 403. Accordingly, an initialization voltage which is less than or equal to the threshold voltage Vth is applied in advance across the gate and source of the drive transistor 401 (S10). It should be noted that, in this step, the predetermined voltage applied to the first electrode of the holding capacitor element 403 may be supplied from the reference power supply line instead of being supplied from the data line 434. In other words, it is sufficient that the voltage to be held across the first electrode and the second electrode of the holding capacitor element 403 be set so as to be less than or equal to the threshold voltage Vth.

Next, the display panel control circuit 12 places the enable transistor 405 in the conducting state to apply the power supply voltage $V_{TFT}$ from the positive power supply line to the drive transistor 401 (S20). Alternatively, the display panel control circuit 12 applies, to the drain or the gate of either the selection transistor 404 or the reference transistor 406, in the state where the enable transistor 405 is in the conducting state, an inspecting voltage which when applied to the gate of the drive transistor 401 would cause the gate-source voltage of the drive transistor 401 to be greater than or equal to the threshold voltage Vth (S20).

Next, the computing unit 13 inspects whether there is a pixel 400 that does not emit light at the moment when step S20 is executed and emits light after an elapse of a predetermined period from such moment (S30). Specifically, the control unit 10 obtains image data of the display unit 41 at the moment (or immediately after) step S20 is executed and image data of the display unit 41 after the elapse of a predetermined period from such moment. Then, the computing unit 13 inspects for a pixel 400 that does not emit light at the moment step S20 is executed and emits light after the elapse of the predetermined period from such moment, by comparing the two types of image data.

Here, the aforementioned predetermined period is, for example, a period that is longer than one frame period in which all the pixel rows are each scanned once on a row-by-row basis from the top-most row to the bottom-most row of the display unit 41. More specifically, whereas in a normal video display scanned at 60 Hz or 120 Hz, one frame period is 16.7 msec. or 8.3 msec., the aforementioned predetermined period is, for example, several tens of msec.

Next, in the case where a pixel 400 that does not emit light at the moment when step S20 is executed and emits light after the elapse of the predetermined period from such moment is detected (Y in S30), the control unit 10 determines such pixel 400 to be a pixel including a transistor in which a leakage current is generated, that is, what is called a leak-defective pixel (S40).

On the other hand, the control unit 10 determines a pixel 400 that does not emit light at the moment when step S20 is executed and also does not emit light after the elapse of the predetermined period from such moment (N in S30) to be a normal pixel (S50).

The cause for the defect of the pixel 400 that is determined to be a leak-defective pixel in step S40 is given below. Specifically, during the elapse of the predetermined period, a leakage current flows out from between any of the source, drain, and gate of any of the drive transistor 401, the selection transistor 404, and the reference transistor 406, for example. With this, the gate potential of the drive transistor 401 rises over time to any of the potentials of the power supply voltage $V_{TFT}$, the data line voltage $V_{DA}$, the reference voltage $V_{REF}$, the scanning line 424 voltage, and the scanning line 426 voltage. Consequently, after the elapse of the predetermined period, the gate-source voltage of the drive transistor 401 becomes a voltage larger than the threshold voltage Vth, and thus the drive transistor 401 is placed in the conducting state, and the organic EL element 402 emits light.

According to the above-described inspecting method, it is possible to precisely inspect for a transistor that changes over time due to a minute leakage current. Therefore, it is possible to prevent a display panel 4 having a pixel 400 that could become bright spot-defective or black dot-defective after shipment from being released into circulation.

It should be noted that, in step S10, it is preferable that the initialization voltage applied across the gate and source of the drive transistor 401 be equal to the threshold voltage Vth of the drive transistor 401 or a voltage which as much as possible approximates the threshold voltage Vth. Accordingly, the time when the drive transistor 401 is placed in the conducting state due to the transistor generating the leakage current can be advanced, and the start time for the light emission of the organic EL element 402, which emits light after the elapse of time, can be advanced. Therefore, the inspection process in the fabricating stage can be shortened.

(5. Display Panel Inspecting Method for Detecting a Current Leak in the Drive Transistor)

Hereinafter, in this embodiment, description is specifically carried out for the inspecting method in the case where a current leak occurs in the drive transistor 401 in particular, among the respective transistors included in the pixel circuit.

Figure 6A:
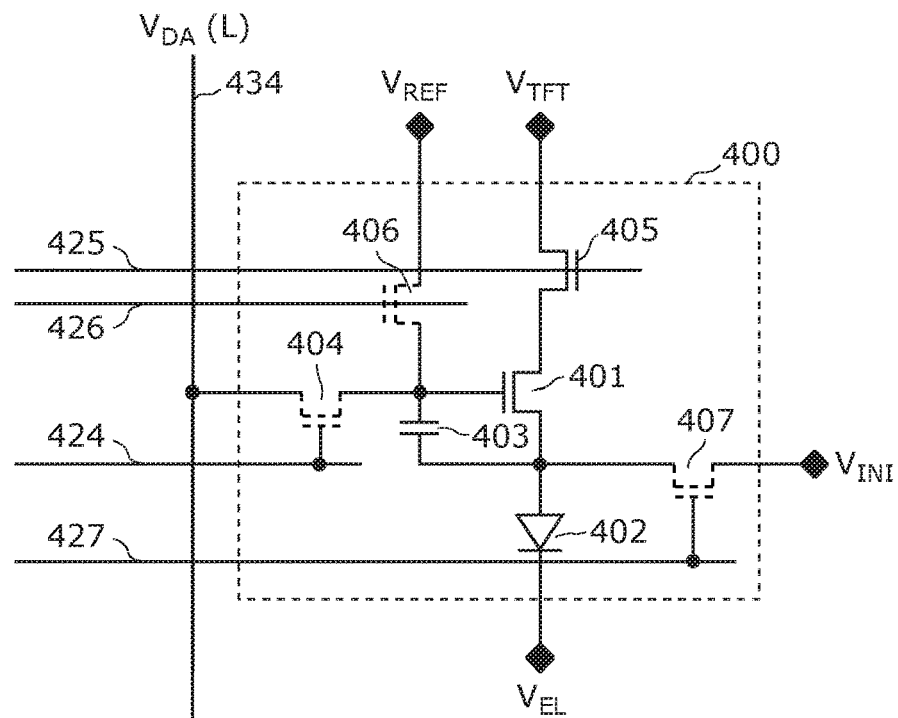
FIG. 6A is a circuit diagram illustrating an operating state of a pixel circuit according to Embodiment 1.
Figure 6B:
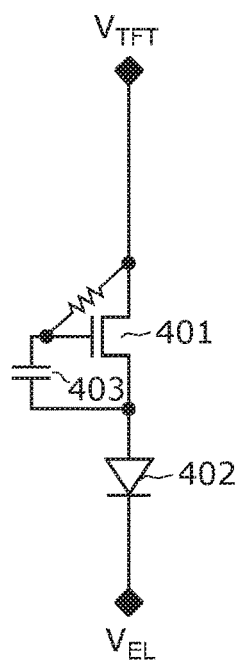
FIG. 6B is an equivalent circuit diagram illustrating an operating state of the pixel circuit according to Embodiment 1.
Figure 7:
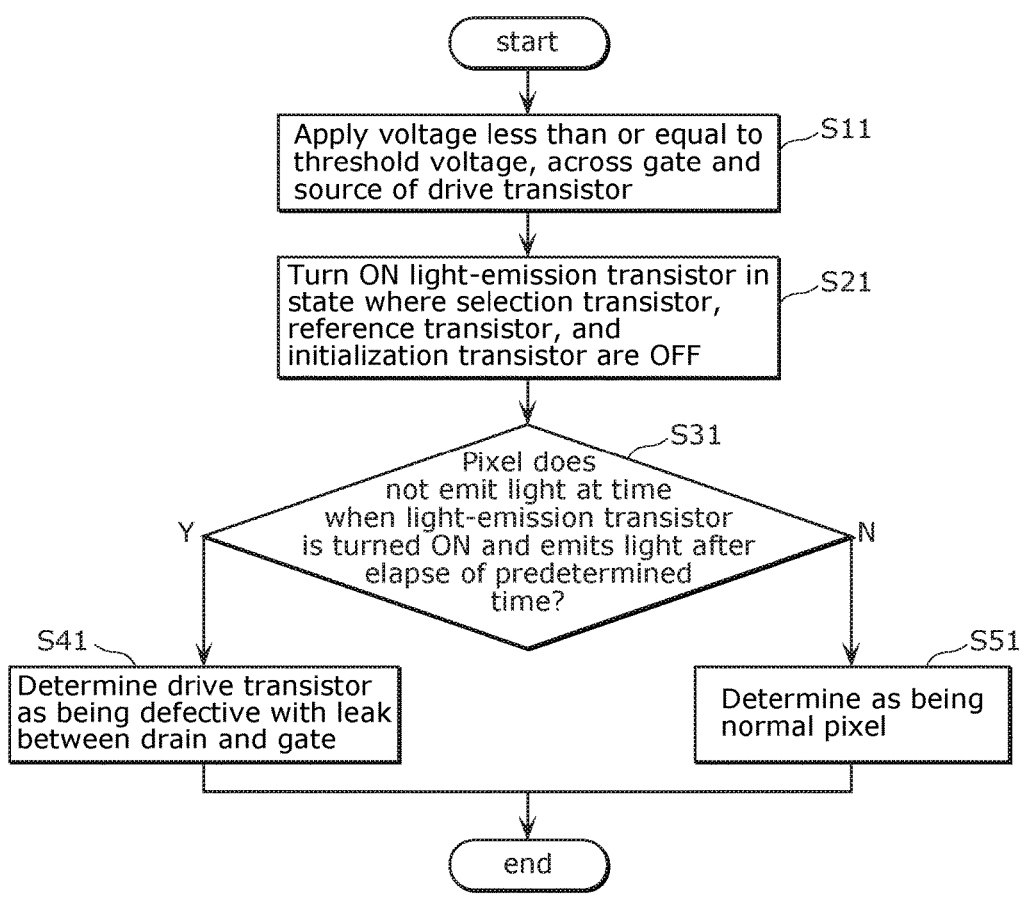
FIG. 7 is an operation flowchart describing the display panel inspecting method according to Embodiment 1.
Figure 8:
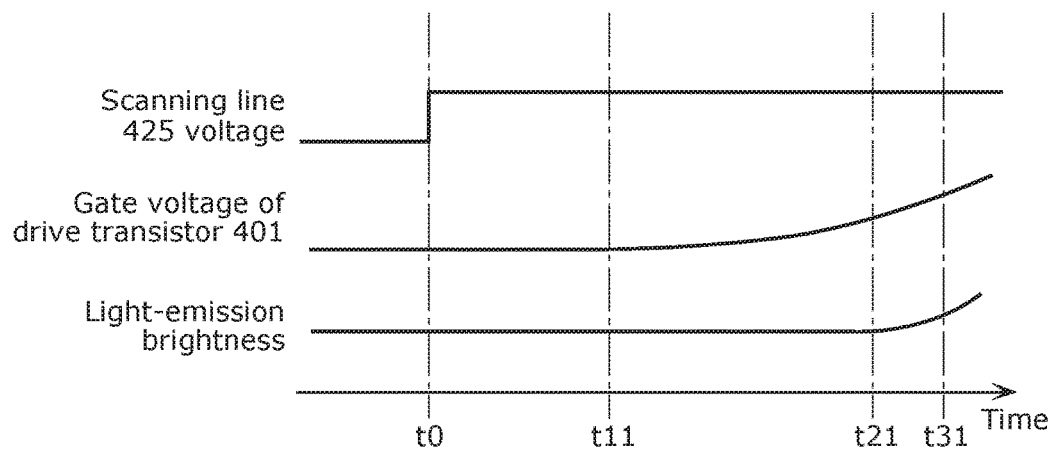
FIG. 8 is a timing chart describing the display panel inspecting method according to Embodiment 1.

FIG. 6A is a circuit diagram illustrating an operating state of the pixel circuit according to Embodiment 1. Furthermore, FIG. 6B is an equivalent circuit diagram illustrating an operating state of the pixel circuit according to Embodiment 1. Furthermore, FIG. 7 is an operation flowchart describing the display panel inspecting method according to Embodiment 1. Furthermore, FIG. 8 is a timing chart describing the display panel inspecting method according to Embodiment 1. An example of the circuit state in step S20 is illustrated in FIG. 6A and FIG. 6B.

First, the display panel control circuit 12 applies an initialization voltage which is less than or equal to the threshold voltage Vth in advance across the gate and source of the drive transistor 401 (S11).

Next, as illustrated in FIG. 8, at time t0, the display panel control circuit 12 supplies a high level voltage to the scanning line 425 to place the enable transistor 405 in the conducting state. Accordingly, the power supply voltage $V_{TFT}$ is applied from the positive power supply line to the drain of the drive transistor 401 (S21). Furthermore, the display panel control circuit 12 supplies a low level voltage to the scanning line 424, the scanning line 426, and the scanning line 427 to place the selection transistor 404, the reference transistor 406, and the initialization transistor 407 in the non-conducting state. Furthermore, the data line 434 voltage $V_{DA}$ is set to a voltage (L) with which the organic EL element 402 does not emit light.

Next, the computing unit 13 inspects whether there is a pixel 400 that does not emit light at the moment the power supply voltage $V_{TFT}$ is applied to the drain of the drive transistor 401 in step S21 and emits light after the elapse of the predetermined period from such moment.

In the case where a pixel 400 that does not emit light at the moment the power supply voltage $V_{TFT}$ is applied to the drain of the drive transistor 401 and emits light after the elapse of a predetermined period from such moment is detected (Y in S31), the control unit 10 determines such pixel 400 to be a pixel 400 including a drive transistor 401 in which a leakage current is generated, that is, what is called a leak-defective pixel (S41).

In this circuit operation, it is possible to detect, for example, a pixel 400 in which a contact defect exists between the gate and drain of the drive transistor 401, as illustrated in FIG. 6B. Specifically, since the power supply voltage $V_{TFT}$ is applied to, for example, the drain of the drive transistor 401 during the elapse of the predetermined period, the contact defect causes a leakage current to flow out from the drain to the gate of the drive transistor 401. Accordingly, as illustrated in FIG. 8, the gate voltage of the drive transistor 401 rises over time to the power supply voltage $V_{TFT}$. In FIG. 8, at time t11, the leakage current flows and the gate voltage of the drive transistor 401 starts to rise. Then, at time t21, the gate-source voltage of the drive transistor 401 becomes a voltage larger than the threshold voltage Vth, and the organic EL element 402 starts to emit light. Then, at time t31, in other words, after the elapse of the predetermined period (time t0 to time t31), the control unit 10 detects the light emission by a leak-defective pixel.

On the other hand, the control unit 10 determines a pixel 400 that does not emit light at the moment the power supply voltage $V_{TFT}$ is applied to the drain of the drive transistor 401 and also does not emit light at time t31 (after the elapse of the predetermined period from such moment) (N in S31) to be a normal pixel (S51).

According to the above-described inspecting method, it is possible to precisely inspect for a drive transistor 401 that changes over time due to a minute leakage current. Therefore, it is possible to prevent a display panel 4 having a pixel 400 that could become bright spot-defective or black dot-defective after shipment from being released into circulation.

Embodiment 2

In this embodiment, a display panel inspecting method for the case where a current leak occurs in the selection transistor 404 is described. Compared to the display panel inspecting method in Embodiment 1, the display panel inspecting method in this embodiment is the same in terms of the circuit structure of the pixel 400, and is different only in terms of the leak-defective pixel inspection procedure. Hereinafter, points which are the same as in Embodiment 1 shall be omitted, and description will be focused on the points of difference.

(1. Display Panel Inspecting Method 1 for Detecting a Current Leak in the Selection Transistor)

Figure 9A:
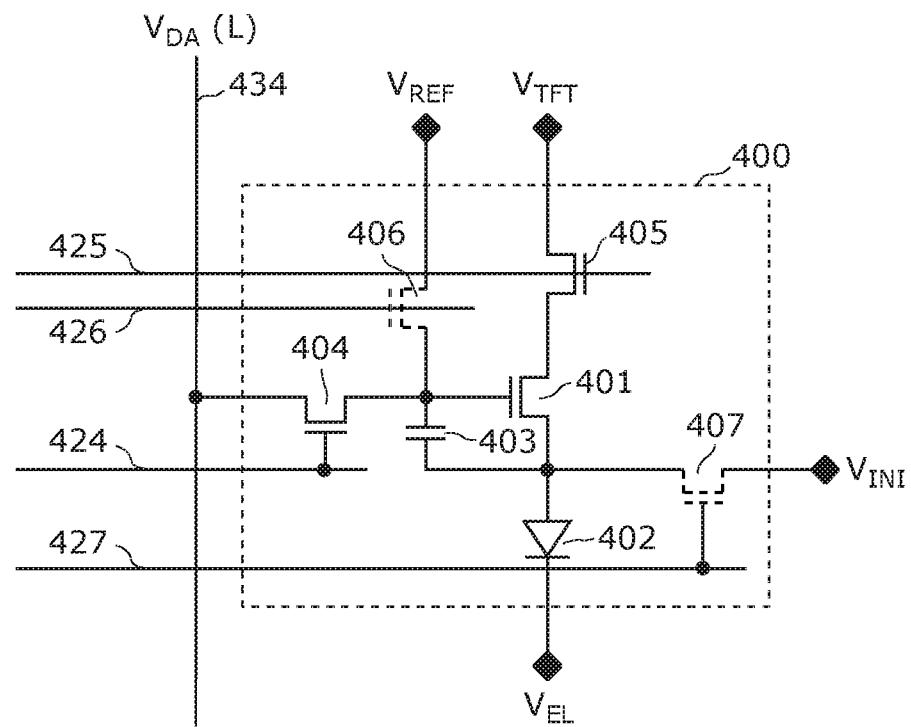
FIG. 9A is a circuit diagram illustrating an operating state of a pixel circuit according to Embodiment 2.
Figure 9B:
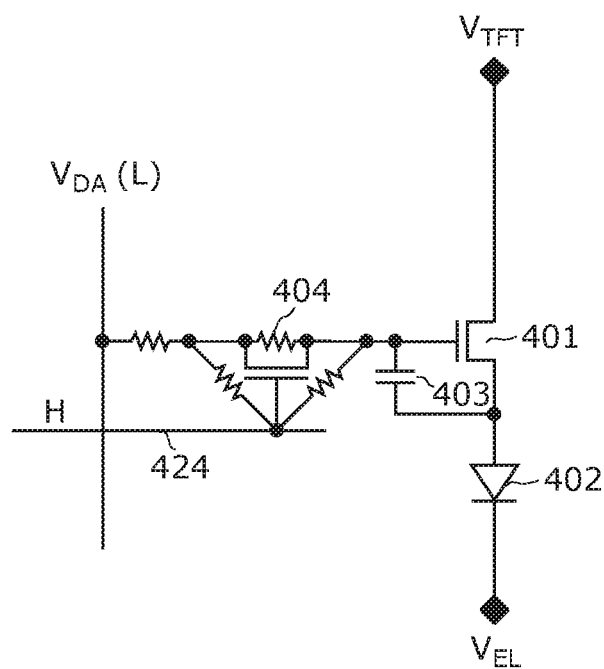
FIG. 9B is an equivalent circuit diagram illustrating an operating state of the pixel circuit according to Embodiment 2.
Figure 10:
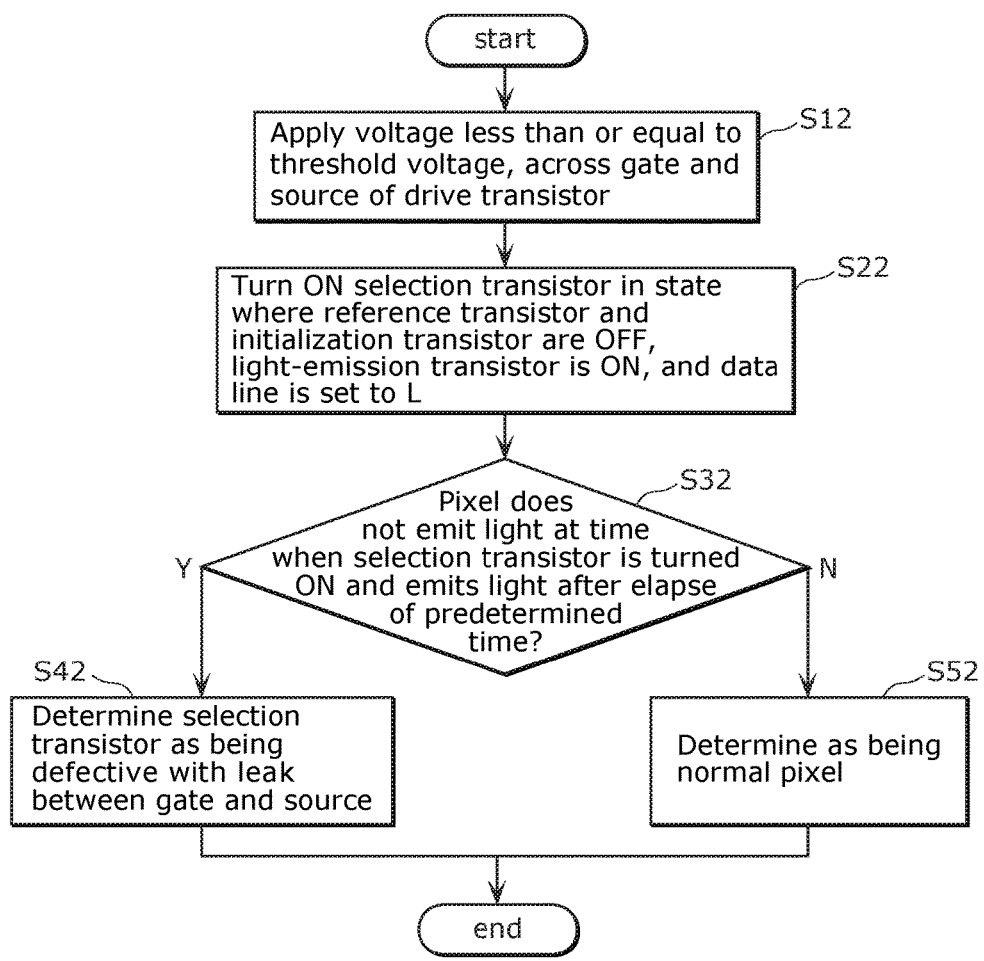
FIG. 10 is an operation flowchart describing the display panel inspecting method according to Embodiment 2.

FIG. 9A is a circuit diagram illustrating an operating state of a pixel circuit according to Embodiment 2. Furthermore, FIG. 9B is an equivalent circuit diagram illustrating an operating state of the pixel circuit according to Embodiment 2. Furthermore, FIG. 10 is an operation flowchart describing the display panel inspecting method according to Embodiment 2. Furthermore, FIG. 11 is a timing chart describing the display panel inspecting method according to Embodiment 2.

First, the display panel control circuit 12 applies an initialization voltage which is less than or equal to the threshold voltage Vth in advance across the gate and source of the drive transistor 401 (S12).

Figure 11:
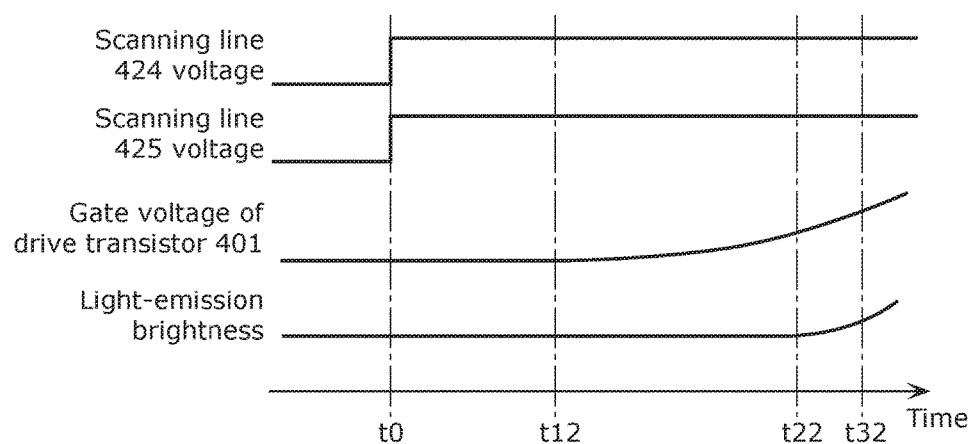
FIG. 11 is a timing chart describing the display panel inspecting method according to Embodiment 2.

Next, as illustrated in FIG. 11, at time t0, the display panel control circuit 12 supplies a high level voltage to the scanning line 424 and the scanning line 425 to place the selection transistor 404 and the enable transistor 405 in the conducting state (S22). Accordingly, the power supply voltage $V_{TFT}$ is applied from the positive power supply line to the drain of the drive transistor 401. Furthermore, the display panel control circuit 12 supplies a low level voltage to the scanning line 426 and the scanning line 427 to place the reference transistor 406 and the initialization transistor 407 in the non-conducting state. Furthermore, the data line 434 voltage $V_{DA}$ is set to the voltage (L) with which the organic EL element 402 does not emit light. Here, the high level voltage supplied to the scanning line 424 is an inspecting voltage which when applied to the gate of the drive transistor 401 would cause the gate-source voltage of the drive transistor 401 to be greater than or equal to the threshold voltage Vth.

Next, the computing unit 13 inspects whether there is a pixel 400 that does not emit light at the moment when the inspecting voltage is supplied to the scanning line 424 in step S22 and emits light after the elapse of the predetermined period from such moment (S32).

In the case where a pixel 400 that does not emit light at the moment when the inspecting voltage is supplied to the scanning line 424 and emits light after the elapse of the predetermined period from such moment is detected (Y in S32), the control unit 10 determines such pixel 400 to be a pixel 400 including a selection transistor 404 in which a leakage current is generated, that is, what is called a leak-defective pixel (S42).

In this circuit operation, it is possible to detect, for example, a pixel 400 in which a contact defect exists between the gate and source or the gate and drain of the selection transistor 404, as illustrated in FIG. 9B. Specifically, since a high level scanning line voltage $V_{424}$, which places the selection transistor 404 in the conducting state, is applied to, for example, the gate of the selection transistor 404 during the elapse of the predetermined period, the contact defect causes a leakage current to flow out from the gate to the source or from the gate to the source, via the drain, of the selection transistor 404. Accordingly, as illustrated in FIG. 11, the gate voltage of the drive transistor 401 rises over time to the scanning line voltage $V_{424}$. Here, the scanning line voltage $V_{424}$ is the inspecting voltage described above. Therefore, in FIG. 11, at time t12, the leakage current flows and the gate voltage of the drive transistor 401 starts to rise. Then, at time t22, the gate-source voltage of the drive transistor 401 becomes a voltage larger than the threshold voltage Vth, and the organic EL element 402 starts to emit light. Then, at time t32, in other words, after the elapse of the predetermined period (time t0 to time t32), the control unit 10 detects the light emission by a leak-defective pixel. It should be noted that the high level scanning line voltage $V_{424}$ which places the selection transistor 404 in the conducting state is, for example, 28 V.

On the other hand, control unit 10 determines a pixel 400 that does not emit light at the moment when the inspecting voltage is supplied to the scanning line 424, and also does not emit light at time t32 (i.e., after the elapse of the predetermined period from such moment) (N in S32) to be a normal pixel (S52).

According to the above-described inspecting method, it is possible to precisely inspect for a selection transistor 404 that changes over time due to a minute leakage current. Therefore, it is possible to prevent a display panel 4 having a pixel 400 that could become bright spot-defective or black dot-defective after shipment from being released into circulation.

It should be noted that although, in step S22, a high level voltage is supplied to the scanning line 424 and the scanning line 425 at time t0 to simultaneously place the selection transistor 404 and the enable transistor 405 in the conducting state, step S22 is not limited to such. For example, in step S22, the high level voltage is first supplied to the scanning line 425 at time t0 to place the enable transistor 405 in the conducting state in advance. Next, at time t01 after the elapse of the predetermined period from time t0, the high level voltage is supplied to the scanning line 424 to place the selection transistor 404 in the conducting state. Accordingly, first, the leakage current inspecting according to Embodiment 1 can be implemented on the drive transistor 401 from time t0 to time t01. Then, after performing the inspecting on drive transistor 401, the current leak inspecting on selection transistor 404 is performed from time t01 onward. Accordingly, the transistor which is the cause of the leak defective pixel can be more precisely identified.

(2. Display Panel Inspecting Method 2 for Detecting a Current Leak in the Selection Transistor)

In the display panel inspecting method according to Embodiment 2, there are cases where a current leak defect in the selection transistor 404 cannot be effectively detected due to the degree of the contact defect, that is, the resistance between the gate, source, and drain of selection transistor 404. For example, when there is a contact defect between the gate and source or between the gate and drain of the selection transistor 404, it is assumed that, even when the high level scanning line voltage $V_{424}$ is applied to the scanning line 424 in step S22, the gate voltage of drive transistor 401 will not rise over time. For example, a leakage current flowing from the gate to the source or the drain of the selection transistor 404 due to the scanning line voltage $V_{424}$ applied to the scanning line 424 flows to the data line 434, without flowing to the gate of the drive transistor 401. In this case, even if there is a current leak defect in the selection transistor 404, the gate-source voltage of the drive transistor 401 does not rise and the organic EL element 402 does not emit light even after the elapse of the predetermined period.

In contrast, according to a display panel inspecting method according to Modification 1 of the this embodiment, the leakage current generated in the selection transistor 404 can be effectively and selectively charged to the holding capacitor element 403. Hereinafter, the display panel inspecting method according to Modification 1 of Embodiment 2 will be described.

Figure 12:
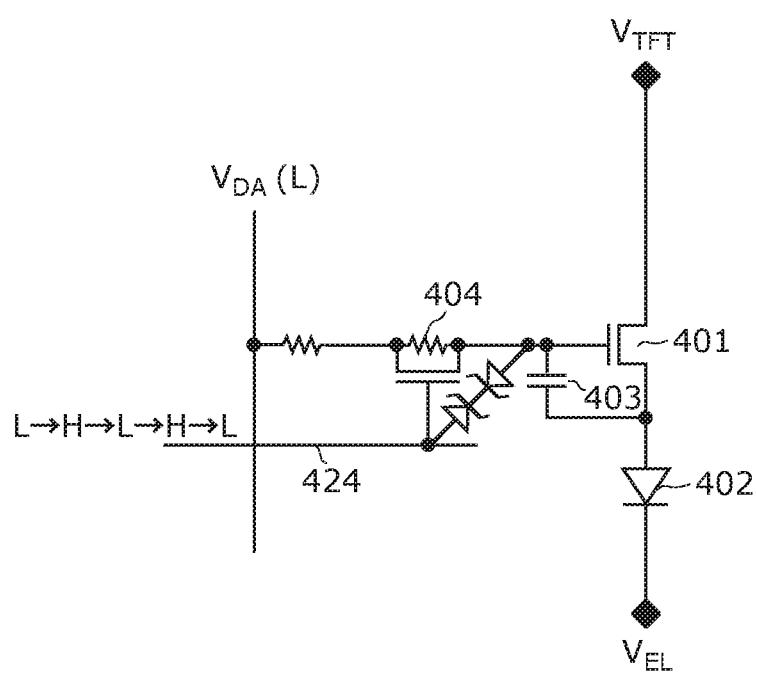
FIG. 12 is an equivalent circuit diagram illustrating an operating state of a pixel circuit according to Modification 1 of Embodiment 2.
Figure 13:
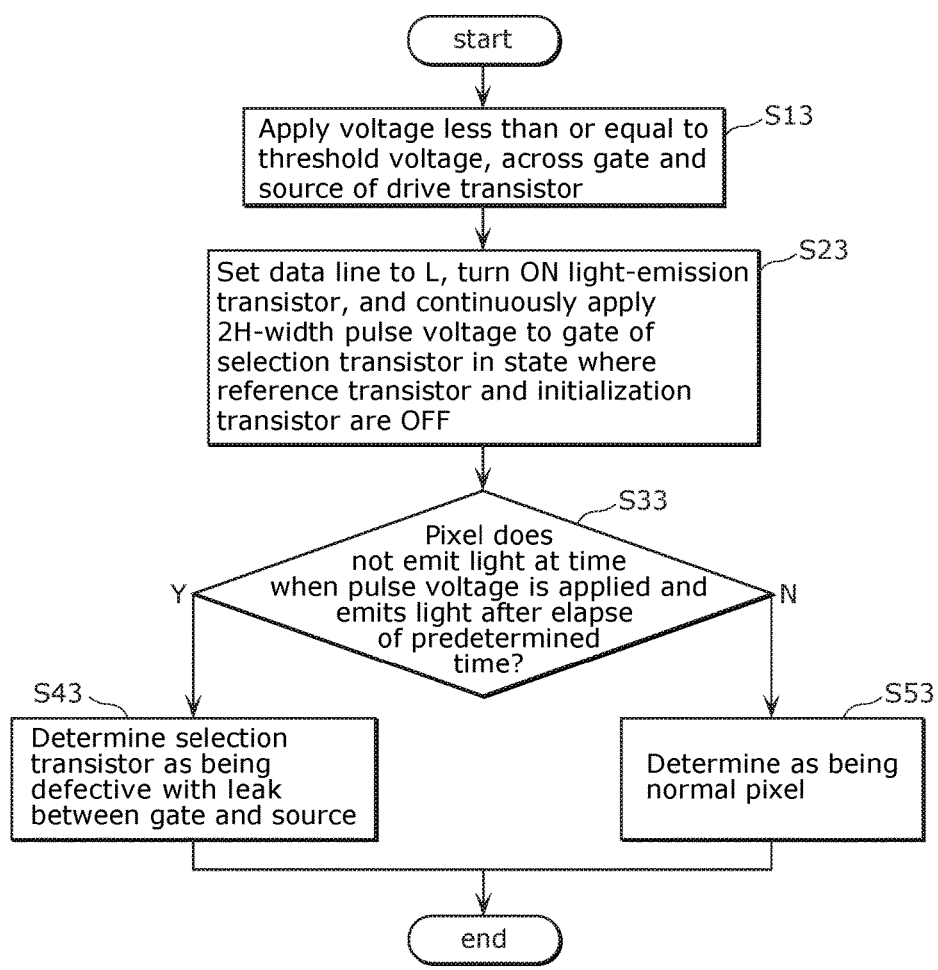
FIG. 13 is an operation flowchart describing the display panel inspecting method according to Modification 1 of Embodiment 2.

FIG. 12 is an equivalent circuit diagram illustrating an operating state of a pixel circuit according to Modification 1 of Embodiment 2. Furthermore, FIG. 13 is an operation flowchart describing the display panel inspecting method according to Modification 1 of Embodiment 2. Furthermore, FIG. 14 is a timing chart describing the display panel inspecting method according to Modification 1 of Embodiment 2.

First, the display panel control circuit 12 applies an initialization voltage which is less than or equal to the threshold voltage Vth in advance across the gate and source of the drive transistor 401 (S13).

Figure 14:
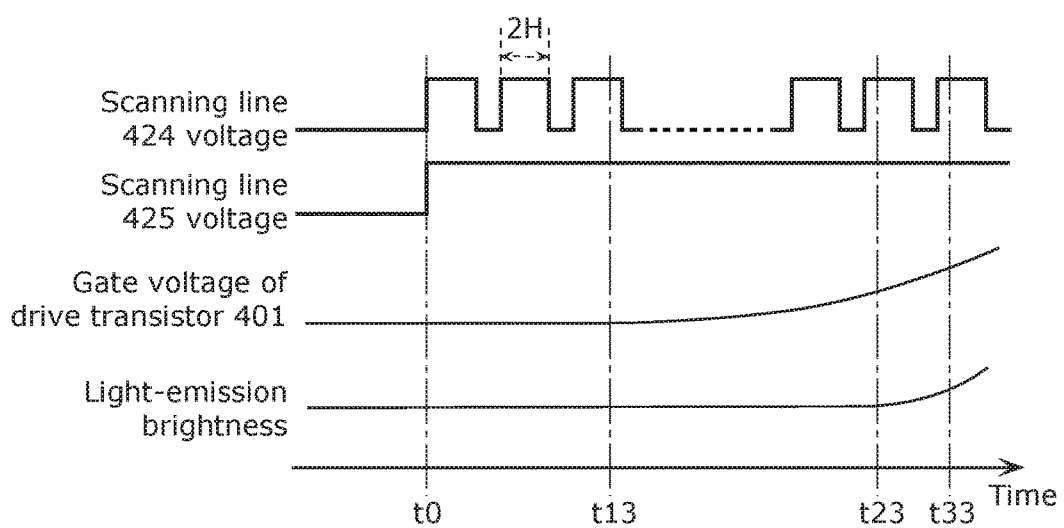
FIG. 14 is a timing chart describing the display panel inspecting method according to Modification 1 of Embodiment 2.

Next, as illustrated in FIG. 14, at time t0, the display panel control circuit 12 supplies a high level voltage to the scanning line 425 to place the enable transistor 405 in the conducting state. Accordingly, the power supply voltage $V_{TFT}$ is applied from the positive power supply line to the drain of the drive transistor 401. Furthermore, the display panel control circuit 12 supplies a low level voltage to the scanning line 426 and the scanning line 427 to place the reference transistor 406 and the initialization transistor 407 in the non-conducting state. Furthermore, the data line 434 voltage $V_{DA}$ is set to the voltage (L) with which the organic EL element 402 does not emit light. In addition, the display panel control circuit 12 continuously outputs as a scanning voltage, to the scanning line 424, a pulse signal having, as a pulse width, a period (2H) that is double one horizontal scanning period in row-by-row scanning, to thereby continuously apply a pulse signal having a 2H pulse width to the gate of the selection transistor 404 (S23). Accordingly, the selection transistor 404 is intermittently placed in the conducting state. It should be noted that, the peak voltage of the pulse signal to be applied to the gate of the selection transistor 404 in this step is, for example, 28 V.

Next, the computing unit 13 inspects whether there is a pixel 400 that does not emit light at the moment when the supplying of the pulse signal to the gate of the selection transistor 404 is started in step S23 and emits light after the elapse of the predetermined period from such moment (S33).

In the case where a pixel 400 that does not emit light at the moment when the supplying of the pulse signal to the gate of the selection transistor 404 is started and emits light after the elapse of the predetermined period from such moment is detected (Y in S33), the control unit 10 determines such pixel 400 to be a pixel 400 including a selection transistor 404 in which a leakage current is generated, that is, what is called a leak-defective pixel (S43).

In this circuit operation, it is possible to detect, for example, a pixel 400 in which the equivalent circuit between the gate and source of the selection transistor 404 has a contact defect configuration such as that represented by a Zener diode as illustrated in FIG. 12. Specifically, during the elapse of the predetermined period, the pulse signal having the 2H pulse width is supplied to the gate of the selection transistor 404. Accordingly, current does not flow from the gate of the selection transistor 404 to the data line 434, and what is called a peak rectified current flows to the holding capacitor element 403 from the gate of the selection transistor 404, via the source of the selection transistor 404. Accordingly, as illustrated in FIG. 14, the gate voltage of the drive transistor 401 rises over time to the pulse voltage peak value of the scanning line voltage $V_{424}$. In FIG. 14, at time t13, the leakage current flows to the holding capacitor element 403, and the gate voltage of the drive transistor 401 starts to rise. Then, at time t23, the gate-source voltage of the drive transistor 401 becomes a voltage larger than the threshold voltage Vth, and the organic EL element 402 starts to emit light. Then, at time t33, in other words, after the elapse of the predetermined period (time t0 to time t33), the control unit 10 detects the light emission by a leak-defective pixel.

On the other hand, control unit 10 determines a pixel 400 that does not emit light at the moment when the supplying of the pulse signal to the scanning line 404 is started, and also does not emit light at time t33 (i.e., after the elapse of the predetermined period from such moment) (N in S33) to be a normal pixel (S53).

According to the above-described inspecting method, it is possible to precisely inspect for a selection transistor 404 that changes over time due to a minute leakage current. Therefore, it is possible to prevent the display panel 4 having pixels that could become bright spot-defective or black dot-defective after shipment from being released into circulation.

It should be noted that although, in Modification 1, a pulse signal having, as a pulse width, a period (2H) that is double one horizontal scanning period in the row-by-row scanning is continuously output to the scanning line 424 in step S23, a pulse signal having a pulse width longer than 2H may be continuously output according to the contact configuration and the resistance between the gate and source of selection transistor 404.

It should be noted that although, in step S23, a high level voltage is supplied to the scanning line 424 and the scanning line 425 at time t0 to simultaneously place the selection transistor 404 and the enable transistor 405 in the conducting state, step S23 is not limited to such. For example, in step S23, the high level voltage is first supplied to the scanning line 425 at time t0 to place the enable transistor 405 in the conducting state in advance. Next, at time t01 after the elapse of the predetermined period from time t0, continuous supply of the pulse signal to the scanning line 424 may be started to place the selection transistor 404 in the conducting state. Accordingly, first, the leakage current inspecting according to Embodiment 1 can be implemented on the drive transistor 401 from time t0 to time t01. Then, after performing the inspecting on drive transistor 401, the current leak inspecting on selection transistor 404 is performed from time t01 onward. Accordingly, the transistor which is the cause of the leak defective pixel can be more precisely identified.

(3. Display Panel Inspecting Method 3 for Detecting a Current Leak in the Selection Transistor)

The display panel inspecting method according to Embodiment 2 and Modification 1 thereof detect a current leak defect between the gate and source or the gate and drain of the selection transistor 404. In contrast, in Modification 2 of this embodiment, a current leak defect between the source and drain of the selection transistor 404 is detected. Hereinafter, a display panel inspecting method according to Modification 2 of Embodiment 2 will be described.

Figure 15A:
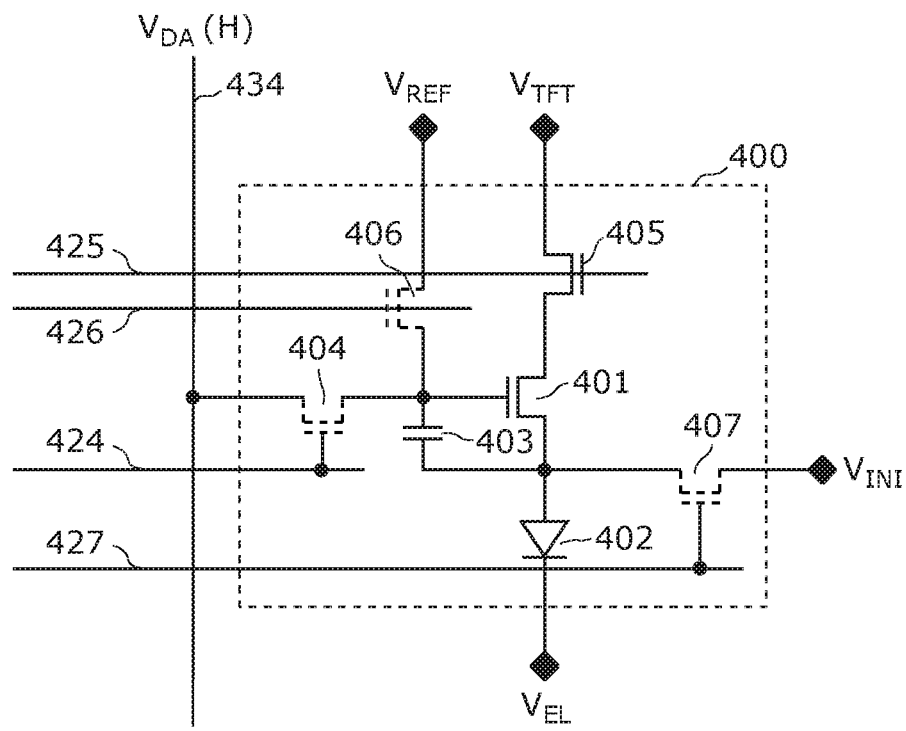
FIG. 15A is a circuit diagram illustrating an operating state of a pixel circuit according to Modification 2 of Embodiment 2.
Figure 15B:
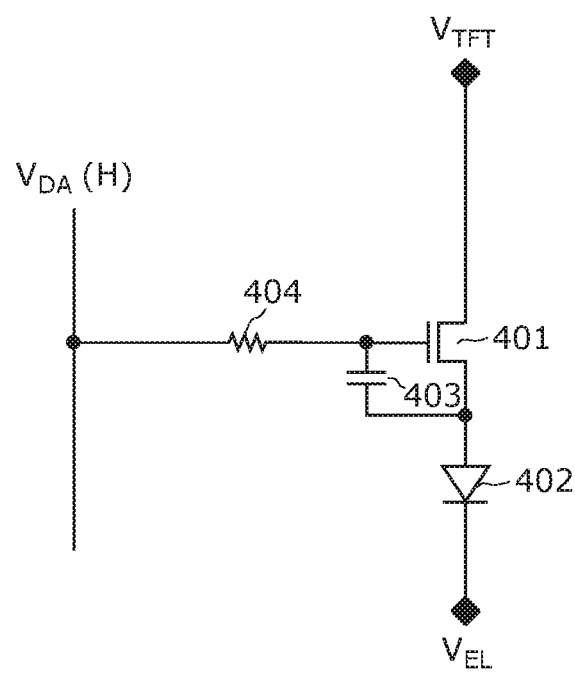
FIG. 15B is an equivalent circuit diagram illustrating an operating state of the pixel circuit according to Modification 2 of Embodiment 2.
Figure 16:
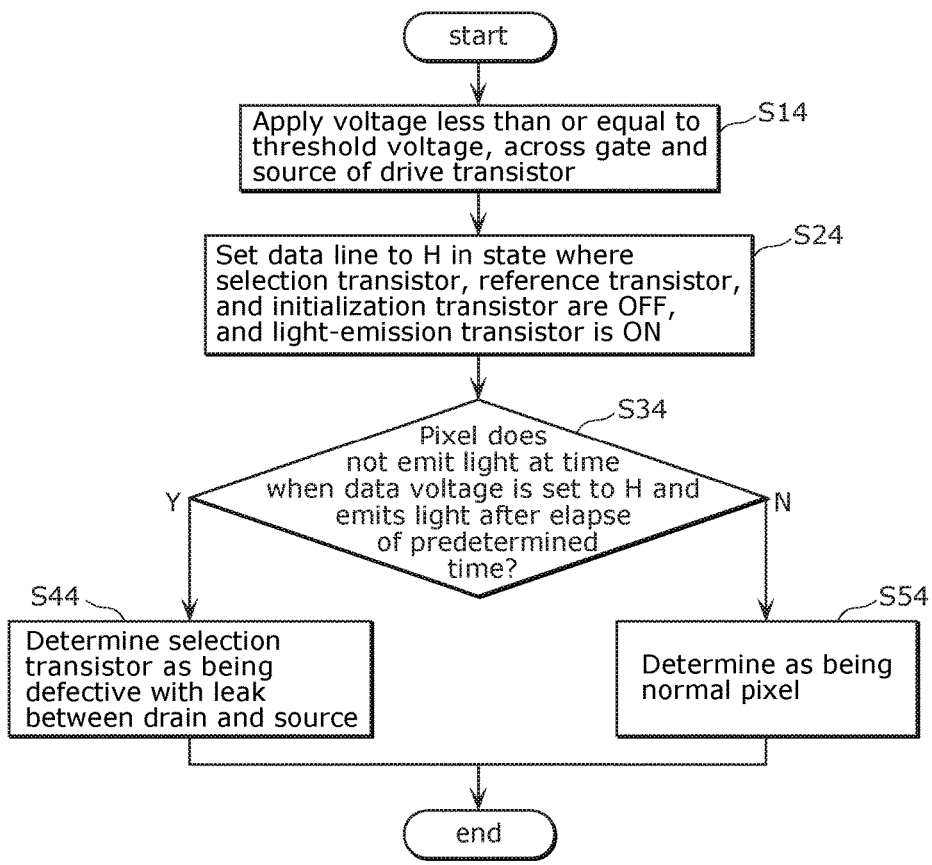
FIG. 16 is an operation flowchart describing the display panel inspecting method according to Modification 2 of Embodiment 2.

FIG. 15A is a circuit diagram illustrating an operating state of a pixel circuit according to Modification 2 of Embodiment 2. Furthermore, FIG. 15B is an equivalent circuit diagram illustrating an operating state of the pixel circuit according to Modification 2 of Embodiment 2. Furthermore, FIG. 16 is an operation flowchart describing the display panel inspecting method according to Modification 2 of Embodiment 2. Furthermore, FIG. 17 is a timing chart describing the display panel inspecting method according to Modification 2 of Embodiment 2.

First, the display panel control circuit 12 applies an initialization voltage which is less than or equal to the threshold voltage Vth in advance across the gate and source of the drive transistor 401 (S14).

Figure 17:
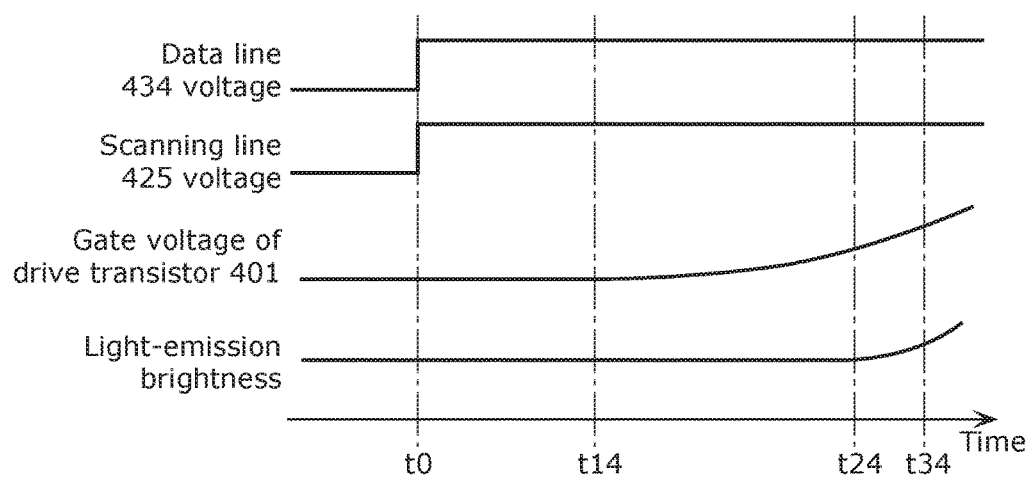
FIG. 17 is a timing chart describing the display panel inspecting method according to Modification 2 of Embodiment 2.

Next, as illustrated in FIG. 17, at time t0, the display panel control circuit 12 supplies a high level voltage to the scanning line 425 to place the enable transistor 405 in the conducting state. Accordingly, the power supply voltage $V_{TFT}$ is applied from the positive power supply line to the drain of the drive transistor 401. Furthermore, the display panel control circuit 12 supplies a low level voltage to the scanning lines 424, 426, and 427 to place the selection transistor 404, the reference transistor 406, and the initialization transistor 407 in the non-conducting state. In this state, the data line 434 voltage $V_{DA}$ is set to the voltage (H) with which the organic EL element 402 emits light (S24). Here, the voltage (H) that is supplied to the data line 434 and with which the organic EL element 402 emits light is an inspecting voltage which when applied to the gate of the drive transistor 401 would cause the gate-source voltage of the drive transistor 401 to be greater than or equal to the threshold voltage Vth. It should be noted that in this step, the voltage $V_{DA}$ that is set to the data line 434 is, for example, 12 V.

Next, the computing unit 13 inspects whether there is a pixel 400 that does not emit light at the moment when the inspecting voltage is supplied to the data line 434 in step S24 and emits light after the elapse of the predetermined period from such moment (S34).

In the case where a pixel 400 that does not emit light at the moment when the inspecting voltage is supplied to the data line 434 and emits light after the elapse of the predetermined period from such moment is detected (Y in S34), the control unit 10 determines such pixel 400 to be a pixel 400 including a selection transistor 404 in which a leakage current is generated, that is, what is called a leak-defective pixel (S44).

In this circuit operation, it is possible to detect, for example, a pixel 400 in which a contact defect exists between the source and drain of the selection transistor 404, as illustrated in FIG. 15B. Specifically, during the elapse of the predetermined period, for example, the voltage (H) with which the organic EL element 402 emits light is supplied to the data line 434. Accordingly, the contact defect causes a leakage current to flow out from the drain to the source of the selection transistor 404. Accordingly, as illustrated in FIG. 17, the gate voltage of the drive transistor 401 rises over time to the data line 434 voltage $V_{DA}$. Here, the data line 434 voltage $V_{DA}$ is the inspecting voltage described above. Therefore, in FIG. 17, at time t14, the leakage current flows and the gate voltage of the drive transistor 401 starts to rise. Then, at time t24, the gate-source voltage of the drive transistor 401 becomes a voltage larger than the threshold voltage Vth, and the organic EL element 402 starts to emit light. Then, at time t34, in other words, after the elapse of the predetermined period (time t0 to time t34), the control unit 10 detects the light emission by a leak-defective pixel.

On the other hand, control unit 10 determines a pixel 400 that does not emit light at the moment when the inspecting voltage is supplied to the data line 434, and also does not emit light at time t34 (i.e., after the elapse of the predetermined period from such moment) (N in S34) to be a normal pixel (S54).

According to the above-described inspecting method, it is possible to precisely inspect for a selection transistor 404 that changes over time due to a minute leakage current. Therefore, it is possible to prevent the display panel 4 having pixels that could become bright spot-defective or black dot-defective after shipment from being released into circulation.

It should be noted that although, in step S24, a high level voltage is supplied to the data line 434 and the scanning line 425 at time t0, step S24 is not limited to such. For example, in step S24, the high level voltage is first supplied to the scanning line 425 at time t0 to place the enable transistor 405 in the conducting state in advance. Next, the inspecting voltage may be supplied to the data line 434 at time t01 after the elapse of the predetermined period from time t0. Accordingly, first, the leakage current inspecting according to Embodiment 1 can be implemented on the drive transistor 401 from time t0 to time t01. Then, after performing the inspecting on drive transistor 401, the current leak inspecting on selection transistor 404 is performed from time t01 onward. Accordingly, the transistor which is the cause of the leak defective pixel can be more precisely identified.

Embodiment 3

In this embodiment, a display panel inspecting method for the case where a current leak is generated in the reference transistor 406 is described. Compared to the display panel inspecting method in Embodiment 1, the display panel inspecting method in this embodiment is the same in terms of the circuit structure of the pixel 400, and is different only in terms of the leak-defective pixel inspection procedure. Hereinafter, points which are the same as in Embodiment 1 shall be omitted, and description will be focused on the points of difference.

(1. Display Panel Inspecting Method 1 for Detecting a Current Leak in the Reference Transistor)

Figure 18A:
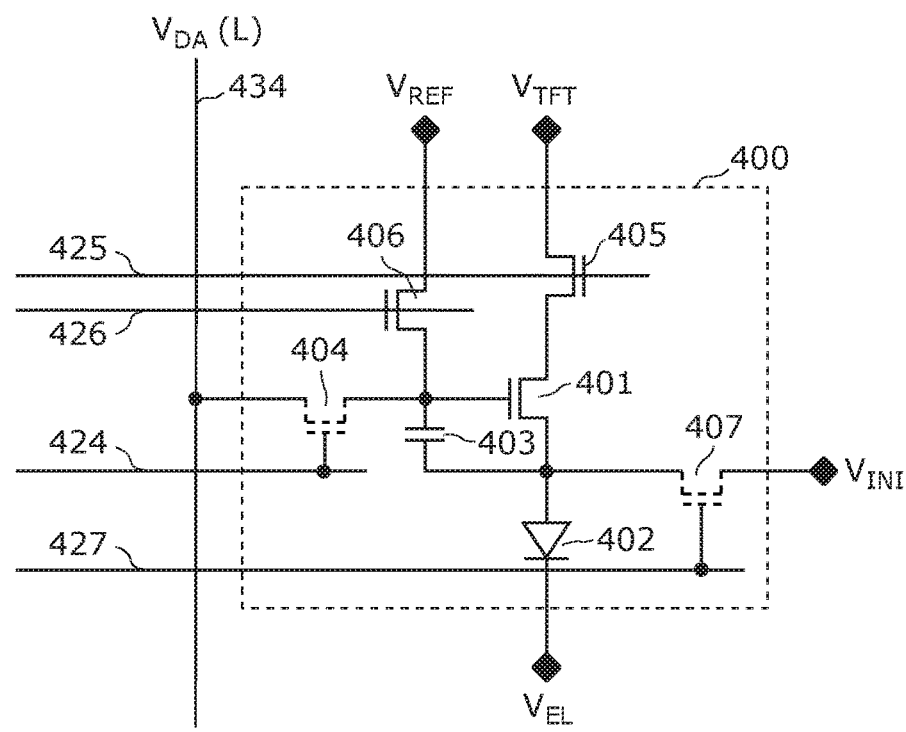
FIG. 18A is a circuit diagram illustrating an operating state of a pixel circuit according to Embodiment 3.
Figure 18B:
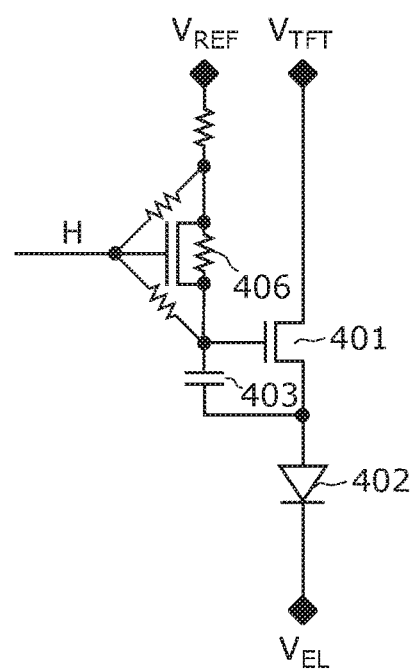
FIG. 18B is an equivalent circuit diagram illustrating an operating state of the pixel circuit according to Embodiment 3.
Figure 19:
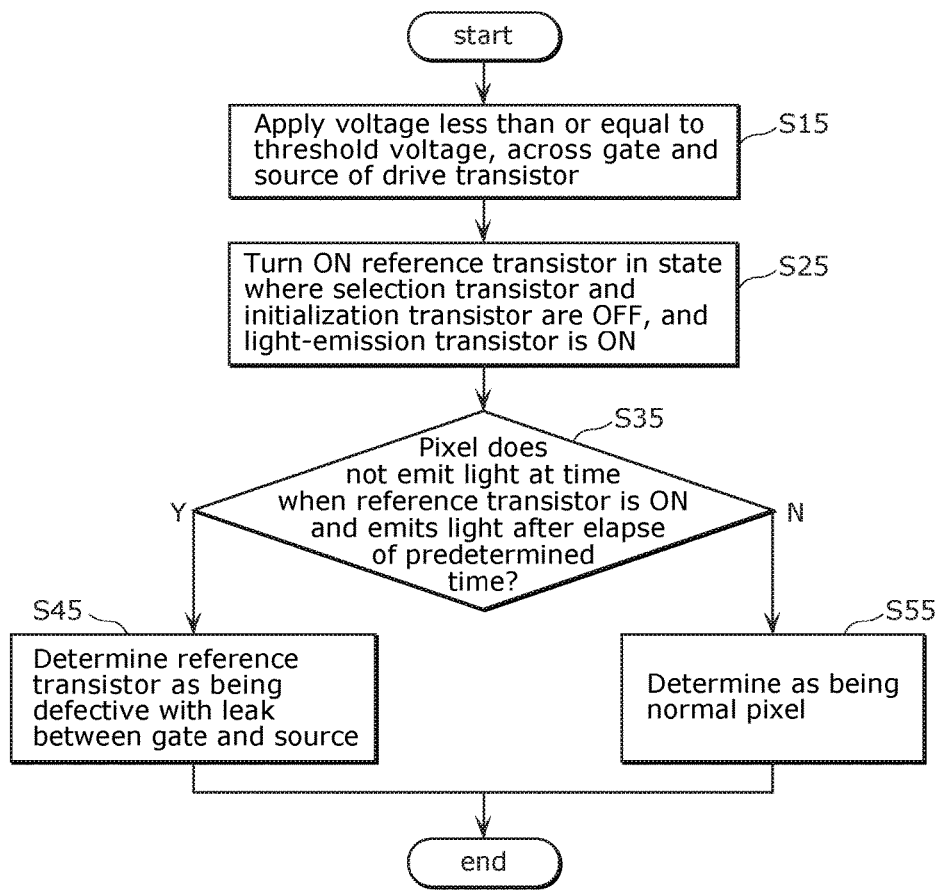
FIG. 19 is an operation flowchart describing the display panel inspecting method according to Embodiment 3.

FIG. 18A is a circuit diagram illustrating an operating state of a pixel circuit according to Embodiment 3. Furthermore, FIG. 18B is an equivalent circuit diagram illustrating an operating state of the pixel circuit according to Embodiment 3. Furthermore, FIG. 19 is an operation flowchart describing the display panel inspecting method according to Embodiment 3. Furthermore, FIG. 20 is a timing chart describing the display panel inspecting method according to Embodiment 3.

First, the display panel control circuit 12 applies an initialization voltage which is less than or equal to the threshold voltage Vth in advance across the gate and source of the drive transistor 401 (S15).

Figure 20:
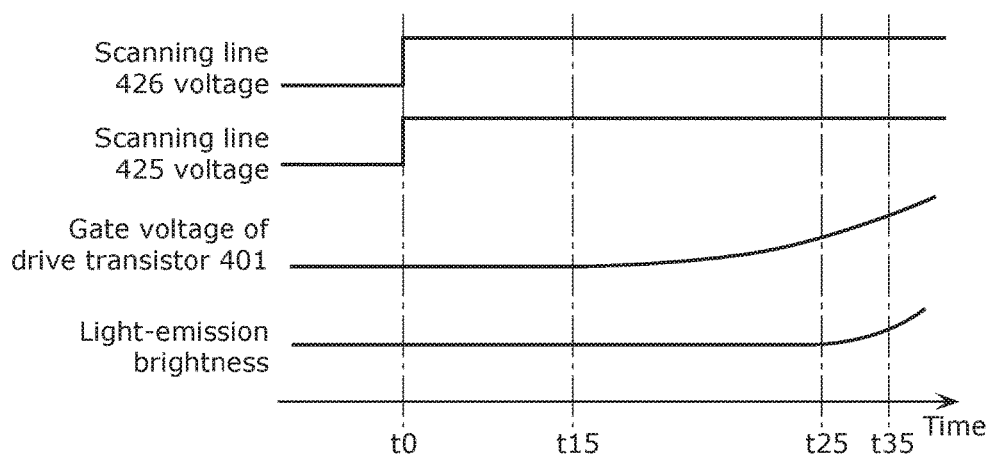
FIG. 20 is a timing chart describing the display panel inspecting method according to Embodiment 3.

Next, as illustrated in FIG. 20, at time t0, the display panel control circuit 12 supplies a high level voltage to the scanning line 426 and the scanning line 425 to place the reference transistor 406 and the enable transistor 405 in the conducting state. Accordingly, the power supply voltage $V_{TFT}$ is applied from the positive power supply line to the drain of the drive transistor 401. Furthermore, the display panel control circuit 12 supplies a low level voltage to the scanning line 424 and the scanning line 427 to place the selection transistor 404 and the initialization transistor 407 in the non-conducting state. Furthermore, the data line 434 voltage $V_{DA}$ is set to the voltage (L) with which the organic EL element 402 does not emit light. Here, the high level voltage supplied to the scanning line 426 is an inspecting voltage which when applied to the gate of the drive transistor 401 would cause the gate-source voltage of the drive transistor 401 to be greater than or equal to the threshold voltage Vth.

Next, the computing unit 13 inspects whether there is a pixel 400 that does not emit light at the moment when the inspecting voltage is supplied to the scanning line 426 in step S25 and emits light after the elapse of the predetermined period from such moment (S35).

In the case where a pixel 400 that does not emit light at the moment when the inspecting voltage is supplied to the scanning line 426 and emits light after the elapse of the predetermined period from such moment is detected (Y in S35), the control unit 10 determines such pixel 400 to be a pixel 400 including a selection transistor 404 in which a leakage current is generated, that is, what is called a leak-defective pixel (S44).

In this circuit operation, it is possible to detect, for example, a pixel 400 in which a contact defect exists between the gate and source or the gate and drain of the reference transistor 406, as illustrated in FIG. 18B. Specifically, since the scanning line voltage $V_{425}$ is applied to, for example, the gate of the reference transistor 406 during the elapse of the predetermined period, the contact defect causes a leakage current to flow out from the gate to the source or from the gate to the source, via the drain, of the reference transistor 406. Accordingly, as illustrated in FIG. 20, the gate voltage of the drive transistor 401 rises over time to the scanning line voltage $V_{425}$. Here, the scanning line voltage $V_{425}$ is the inspecting voltage described above. Therefore, in FIG. 20, at time t15, the leakage current flows and the gate voltage of the drive transistor 401 starts to rise. Then, at time t25, the gate-source voltage of the drive transistor 401 becomes a voltage larger than the threshold voltage Vth, and the organic EL element 402 starts to emit light. Then, at time t35, in other words, after the elapse of the predetermined period (time t0 to time t35), the control unit 10 detects the light emission by a leak-defective pixel.

On the other hand, control unit 10 determines a pixel 400 that does not emit light at the moment when the inspecting voltage is supplied to the scanning line 426, and also does not emit light at time t35 (i.e., after the elapse of the predetermined period from such moment) (N in S35) to be a normal pixel (S55).

According to the above-described inspecting method, it is possible to precisely inspect for a reference transistor 406 that changes over time due to a minute leakage current. Therefore, it is possible to prevent the display panel 4 having pixels that could become bright spot-defective or black dot-defective after shipment from being released into circulation.

It should be noted that although, in step S25, a high level voltage is supplied to the scanning line 426 and the scanning line 425 at time t0 to simultaneously place the reference transistor 406 and the enable transistor 405 in the conducting state, step S25 is not limited to such. For example, in step S25, the high level voltage is first supplied to the scanning line 425 at time t0 to place the enable transistor 405 in the conducting state in advance. Next, at t01 after the elapse of the predetermined period from t0, the high level voltage may be supplied to the scanning line 426 to place the reference transistor 406 in the conducting state. Accordingly, first, the leakage current inspecting according to Embodiment 1 can be implemented on the drive transistor 401 from time t0 to time t01. Then, after performing the inspecting on drive transistor 401, the current leak inspecting on reference transistor 406 is performed from time t01 onward. Accordingly, the transistor which is the cause of the leak defective pixel can be more precisely identified.

(2. Display Panel Inspecting Method 2 for Detecting a Current Leak in the Reference Transistor)

In the display panel inspecting method according to Embodiment 3, there are cases where a current leak defect in the reference transistor 406 cannot be effectively detected due to the degree of the contact defect, that is, the resistance between the gate, source, and drain of reference transistor 406. For example, when there is a contact defect between the gate and source or between the gate and drain of the reference transistor 406, it is assumed that, even when the high level scanning line voltage $V_{426}$ is applied to the scanning line 426 in step S25, the gate voltage of drive transistor 401 will not rise over time. For example, a leakage current flowing from the gate to the source or the drain of the reference transistor 406 due to the scanning line voltage $V_{426}$ applied to the scanning line 426 flows to the reference power supply line, without flowing to the gate of the drive transistor 401. In this case, even if there is a current leak defect in the reference transistor 406, the gate-source voltage of the drive transistor 401 does not rise and the organic EL element 402 does not emit light even after the elapse of the predetermined period.

In contrast, according to a display panel inspecting method according to Modification 1 of the this embodiment, the leakage current generated in the reference transistor 406 can be effectively and selectively charged to the holding capacitor element 403. Hereinafter, the display panel inspecting method according to Modification 1 of Embodiment 3 will be described.

Figure 21:
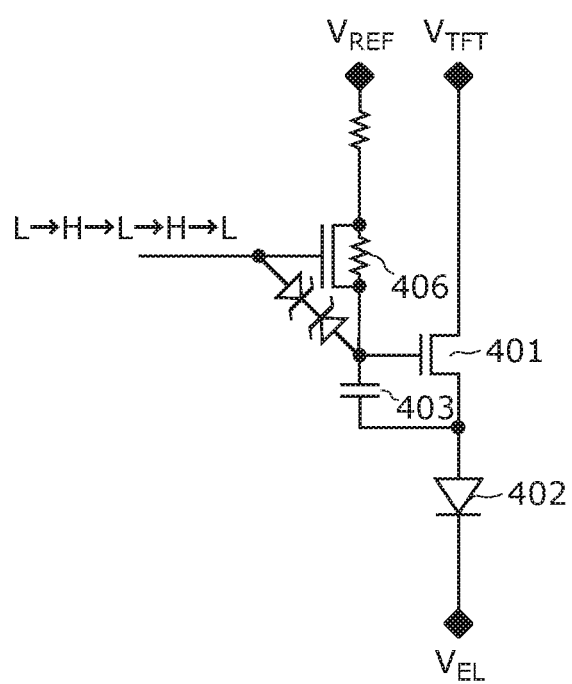
FIG. 21 is an equivalent circuit diagram illustrating an operating state of a pixel circuit according to Modification 1 of Embodiment 3.
Figure 22:
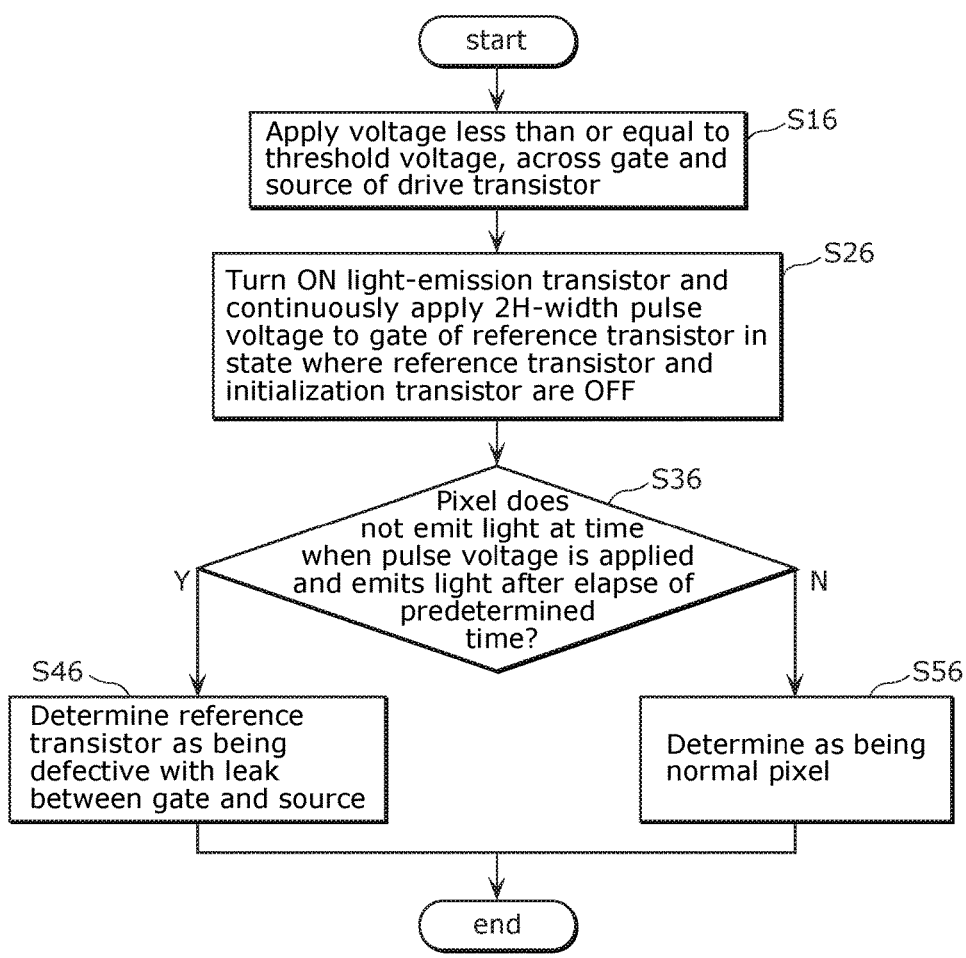
FIG. 22 is an operation flowchart describing the display panel inspecting method according to Modification 1 of Embodiment 3.

FIG. 21 is an equivalent circuit diagram illustrating an operating state of a pixel circuit according to Modification 1 of Embodiment 3. Furthermore, FIG. 22 is an operation flowchart describing the display panel inspecting method according to Modification 1 of Embodiment 3. Furthermore, FIG. 23 is a timing chart describing the display panel inspecting method according to Modification 1 of Embodiment 3.

First, the display panel control circuit 12 applies an initialization voltage which is less than or equal to the threshold voltage Vth in advance across the gate and source of the drive transistor 401 (S16).

Figure 23:
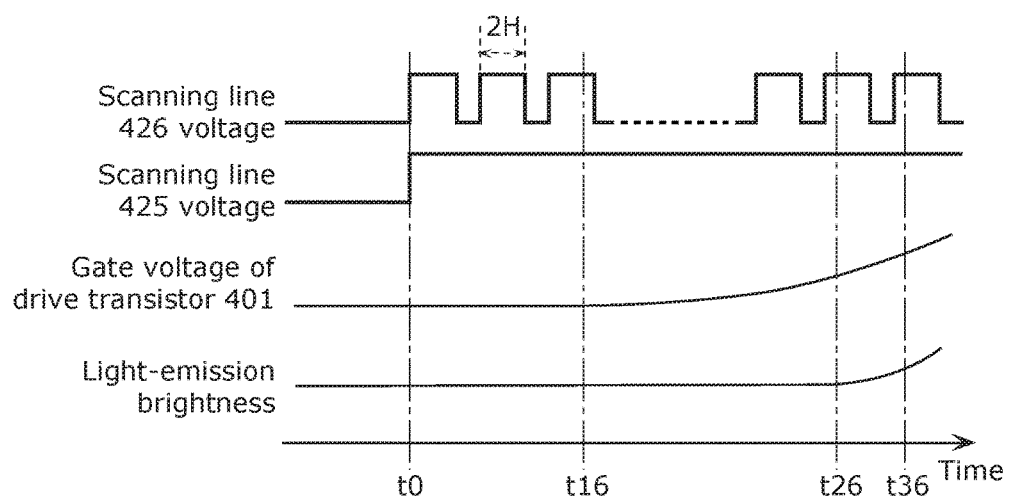
FIG. 23 is a timing chart describing the display panel inspecting method according to Modification 1 of Embodiment 3.

Next, as illustrated in FIG. 23, at time t0, the display panel control circuit 12 supplies a high level voltage to the scanning line 425 to place the enable transistor 405 in the conducting state. Accordingly, the power supply voltage $V_{TFT}$ is applied from the positive power supply line to the drain of the drive transistor 401. Furthermore, the display panel control circuit 12 supplies a low level voltage to the scanning line 424 and the scanning line 427 to place the selection transistor 404 and the initialization transistor 407 in the non-conducting state. Furthermore, the data line 434 voltage $V_{DA}$ is set to the voltage (L) with which the organic EL element 402 does not emit light. In addition, the display panel control circuit 12 continuously outputs as a scanning voltage, to the scanning line 426, a pulse signal having, as a pulse width, a period (2H) that is double one horizontal scanning period in the row-by-row scanning, to thereby continuously apply a pulse signal having a 2H pulse width to the gate of the reference transistor 406 (S26). Accordingly, the reference transistor 406 is intermittently placed in the conducting state. It should be noted that, the peak voltage of the pulse signal to be applied to the gate of the reference transistor 406 in this step is, for example, 28 V.

Next, the computing unit 13 inspects whether there is a pixel 400 that does not emit light at the moment when the power supply voltage $V_{TFT}$ is applied to the drain of the drive transistor 401 in step S26 and emits light after the elapse of the predetermined period from such moment (S36).

In the case where a pixel 400 that does not emit light at the moment when the supplying of the pulse signal to the gate of the reference transistor 406 is started and emits light after the elapse of the predetermined period from such moment is detected (Y in S36), the control unit 10 determines such pixel 400 to be a pixel 400 including a reference transistor 406 in which a leakage current is generated, that is, what is called a leak-defective pixel (S46).

In this circuit operation, it is possible to detect, for example, a pixel 400 in which the equivalent circuit between the gate and source of the reference transistor 406 has a contact defect configuration such as that represented by a Zener diode as illustrated in FIG. 21. Specifically, during the elapse of the predetermined period, the pulse signal having the 2H pulse width is supplied to the gate of the reference transistor 406. Accordingly, current does not flow from the gate of the reference transistor 406 to the reference power supply line, and what is called a peak rectified current flows to the holding capacitor element 403 from the gate of the reference transistor 406, via the source of the reference transistor 406. Accordingly, as illustrated in FIG. 23, the gate voltage of the drive transistor 401 rises over time to peak voltage value of the scanning line voltage $V_{425}$. In FIG. 23, at time t16, the leakage current flows to the holding capacitor element 403, and the gate voltage of the drive transistor 401 starts to rise. Then, at time t26, the gate-source voltage of the drive transistor 401 becomes a voltage larger than the threshold voltage Vth, and the organic EL element 402 starts to emit light. Then, at time t36, in other words, after the elapse of the predetermined period (time t0 to time t36), the control unit 10 detects the light emission by a leak-defective pixel.

On the other hand, control unit 10 determines a pixel 400 that does not emit light at the moment when the supplying of the pulse signal to the reference transistor 406 is started, and also does not emit light at time t36 (i.e., after the elapse of the predetermined period from such moment) (N in S36) to be a normal pixel (S56).

According to the above-described inspecting method, it is possible to precisely inspect for a reference transistor 406 that changes over time due to a minute leakage current. Therefore, it is possible to prevent a display panel 4 having a pixel 400 that become bright spot-defective or black dot-defective after shipment from being released into circulation.

It should be noted that although, in Modification 1, a pulse signal having, as a pulse width, a period (2H) that is double one horizontal scanning period in the row-by-row scanning is continuously output to the scanning line 426 in step S26, a pulse signal having a pulse width longer than 2H may be continuously output according to the contact configuration and the resistance between the gate and source of reference transistor 406.

It should be noted that although, in step S26, a high level voltage is supplied to the scanning line 426 and the scanning line 425 at time t0 to simultaneously place the reference transistor 406 and the enable transistor 405 in the conducting state, step S26 is not limited to such. For example, in step S26, the high level voltage is first supplied to the scanning line 425 at time t0 to place the enable transistor 405 in the conducting state in advance. Next, at time t01 after the elapse of the predetermined period from time t0, continuous supply of the pulse signal to the scanning line 426 may be started to place the reference transistor 406 in the conducting state. Accordingly, first, the leakage current inspecting according to Embodiment 1 can be implemented on the drive transistor 401 from time t0 to time t01. Then, after performing the inspecting on drive transistor 401, the current leak inspecting on reference transistor 406 is performed from time t01 onward. Accordingly, the transistor which is the cause of the leak defective pixel can be more precisely identified.

(3. Display Panel Inspecting Method 3 for Detecting a Current Leak in the Reference Transistor)

The display panel inspecting method according to Embodiment 3 and Modification 1 thereof detect a current leak defect between the gate and source or the gate and drain of the reference transistor 406. In contrast, in Modification 2 of this embodiment, a current leak defect between the source and drain of the reference transistor 406 is detected. Hereinafter, the display panel inspecting method according to Modification 2 of Embodiment 3 will be described.

Figure 24A:
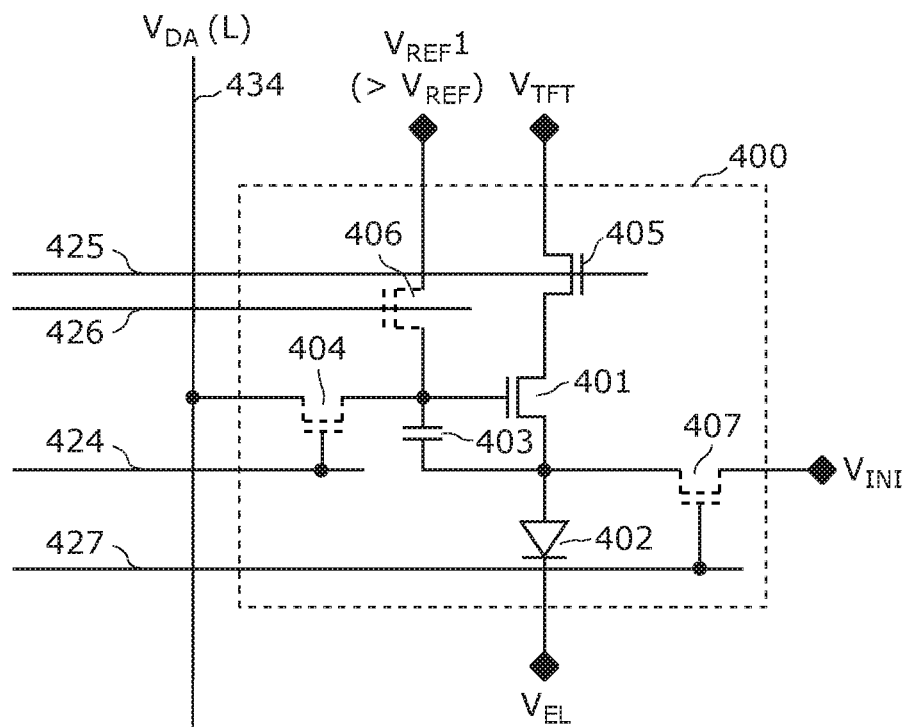
FIG. 24A is a circuit diagram illustrating an operating state of a pixel circuit according to Modification 2 of Embodiment 3.
Figure 24B:
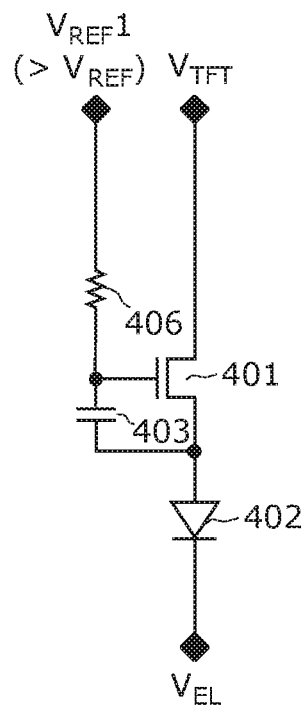
FIG. 24B is an equivalent circuit diagram illustrating an operating state of the pixel circuit according to Modification 2 of Embodiment 3.
Figure 25:
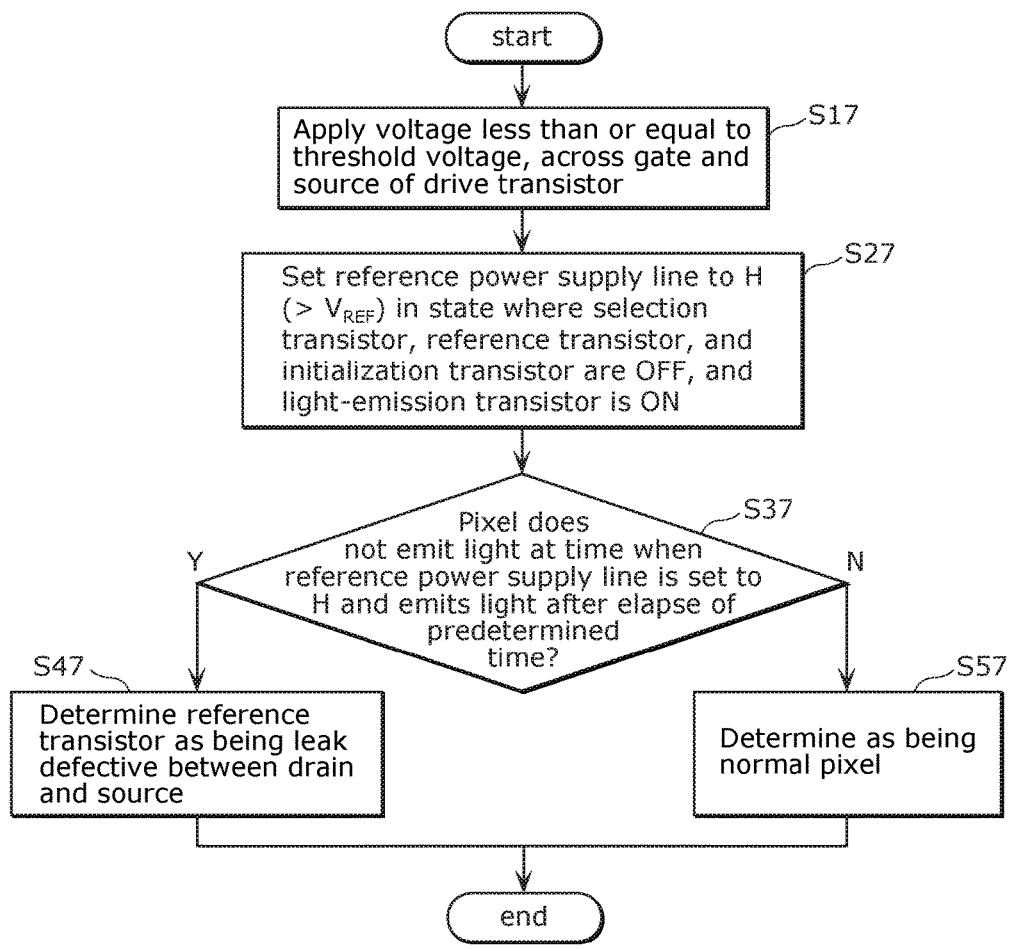
FIG. 25 is an operation flowchart describing the display panel inspecting method according to Modification 2 of Embodiment 3.

FIG. 24A is a circuit diagram illustrating an operating state of a pixel circuit according to Modification 2 of Embodiment 3. Furthermore, FIG. 24B is an equivalent circuit diagram illustrating an operating state of the pixel circuit according to Modification 2 of Embodiment 3. Furthermore, FIG. 25 is an operation flowchart describing the display panel inspecting method according to Modification 2 of Embodiment 3. Furthermore, FIG. 26 is a timing chart describing the display panel inspecting method according to Modification 2 of Embodiment 3.

First, the display panel control circuit 12 applies an initialization voltage which is less than or equal to the threshold voltage Vth in advance across the gate and source of the drive transistor 401 (S17).

Figure 26:
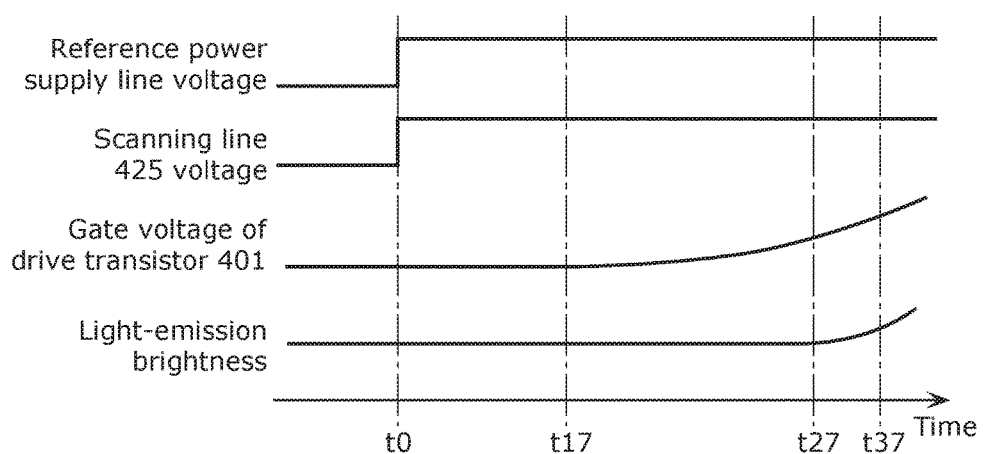
FIG. 26 is a timing chart describing the display panel inspecting method according to Modification 2 of Embodiment 3.

Next, as illustrated in FIG. 26, at time t0, the display panel control circuit 12 supplies a high level voltage to the scanning line 425 to place the enable transistor 405 in the conducting state. Accordingly, the power supply voltage $V_{TFT}$ is applied from the positive power supply line to the drain of the drive transistor 401. Furthermore, the display panel control circuit 12 supplies a low level voltage to the scanning lines 424, 426, and 427 to place the selection transistor 404, the reference transistor 406, and the initialization transistor 407 in the non-conducting state. In this state, the voltage of the reference power supply line is set to a voltage larger than the reference voltage $V_{REF}$ (S27). Here, the voltage supplied to the reference power supply line which is larger than the reference voltage $V_{REF}$ is an inspecting voltage which when applied to the gate of the drive transistor 401 causes the gate-source voltage of the drive transistor 401 to be greater than or equal to the threshold voltage Vth. It should be noted that in this step, the voltage that is set to the reference power supply line is, for example, 12 V.

Next, the computing unit 13 inspects whether there is a pixel 400 that does not emit light at the moment when the inspecting voltage is supplied to the reference power supply line in step S27 and emits light after the elapse of the predetermined period from such moment (S37).

In the case where a pixel 400 that does not emit light at the moment when the inspecting voltage is supplied to the reference power supply line and emits light after the elapse of the predetermined period from such moment is detected (Y in S37), the control unit 10 determines such pixel 400 to be a pixel 400 including a reference transistor 406 in which a leakage current is generated, that is, what is called a leak-defective pixel (S47).

In this circuit operation, it is possible to detect, for example, a pixel 400 in which a contact defect exists between the source and drain of the reference transistor 406, as illustrated in FIG. 24B. Specifically, during the elapse of the predetermined period, for example, a voltage ($>V_{REF}$)

with which the organic EL element 402 emits light is supplied to the reference power supply line. Accordingly, the contact defect causes a leakage current to flow out from the drain to the source of the reference transistor 406. Accordingly, as illustrated in FIG. 26, the gate voltage of the drive transistor 401 rises over time to the reference power supply line voltage. Here, the voltage of the reference power supply line is the inspecting voltage described above. Therefore, in FIG. 26, at time t17, the leakage current flows and the gate voltage of the drive transistor 401 starts to rise. Then, at time t27, the gate-source voltage of the drive transistor 401 becomes a voltage larger than the threshold voltage Vth, and the organic EL element 402 starts to emit light. Then, at time t37, in other words, after the elapse of the predetermined period (time t0 to time t37), the control unit 10 detects the light emission by a leak-defective pixel.

It should be noted that, when the voltage set to the reference power source line in step S27 is the reference voltage $V_{REF}$, it is assumed that, even if there is a leak defect between the source and drain of the reference transistor 406, the gate-source voltage of the drive transistor 401 will not change over time to become a voltage larger than the threshold voltage Vth. Therefore, the voltage set to the reference power supply line in step S27 is a voltage larger than the reference voltage $V_{REF}$.

On the other hand, control unit 10 determines a pixel 400 that does not emit light at the moment when the inspecting voltage is supplied to the reference power supply line, and also does not emit light at time t37 (i.e., after the elapse of the predetermined period from such moment) (N in S37) to be a normal pixel (S57).

According to the above-described inspecting method, it is possible to precisely inspect for a reference transistor 406 that changes over time due to a minute leakage current. Therefore, it is possible to prevent the display panel 4 having pixels that could become bright spot-defective or black dot-defective after shipment from being released into circulation.

It should be noted that although, in step S27, a high level voltage is supplied to the reference power supply line and the scanning line 425 at time t0, step S27 is not limited to such. For example, in step S27, the high level voltage is first supplied to the scanning line 425 at time t0 to place the enable transistor 405 in the conducting state in advance. Next, the inspecting voltage may be supplied to the reference power supply line at time t01 after the elapse of the predetermined period from time t0. Accordingly, first, the leakage current inspecting according to Embodiment 1 can be implemented on the drive transistor 401 from time t0 to time t01. Then, after performing the inspecting on drive transistor 401, the current leak inspecting on reference transistor 406 is performed from time t01 onward. Accordingly, the transistor which is the cause of the leak defective pixel can be more precisely identified.

Advantageous Effects, Etc.

As described above, a display panel inspecting method according to an aspect of the present disclosure is a method for inspecting a display panel 4 in which pixels 400 are arranged in rows and columns, the pixels 400 each including: a drive transistor 401 that passes a drive current when a signal voltage reflecting an image signal is applied to a gate of the drive transistor 401, the drive current corresponding to the signal voltage; an organic EL element 402 that emits, when the drive current flows through, a light having a brightness corresponding to the drive current; and a switch transistor having a source and a drain, one of which is connected to the gate of the drive transistor 401, the display panel inspecting method including: (S10) applying an initialization voltage less than or equal to threshold voltage Vth across the gate and a source of the drive transistor 401; (S20) applying a power supply voltage $V_{TFT}$ for generating the drive current to the drain of the drive transistor 401 in a state where the initialization voltage is applied across the gate and the source of the drive transistor 401, or applying, to the other of the source and the drain of the switch transistor or the gate of the switch transistor, an inspecting voltage which when applied to the gate of the drive transistor 401 causes the gate-source voltage of the drive transistor 401 to be greater than or equal to the threshold voltage Vth; and (S40) determining, as being a defective pixel with a current leak, a pixel 40 having an organic EL element 402 that does not emit light at a moment when S20 is executed and emits light after an elapse of a predetermined period.

Accordingly, when a current leak occurs in the drive transistor 401 or a transistor connected to the drive transistor 401, leakage current flows out between the source, drain, and gate of the transistor during the elapse of the predetermined period. Accordingly, the gate potential of the drive transistor 401 rises over time. Consequently, after the elapse of the predetermined period, the gate-source voltage of the drive transistor 401 becomes a voltage larger than the threshold voltage Vth, and thus the drive transistor 401 is placed in the conducting state, and the organic EL element 402 emits light. Therefore, it is possible to precisely inspect for a transistor that changes over time due to a minute leakage current. Therefore, it is possible to prevent the display panel 4 having pixels that could become bright spot-defective or black dot-defective after shipment from being released into circulation.

Furthermore, the predetermined period may be longer than one frame period in which all of the pixels 400 are scanned.

In the case where any of the respective transistors included in a pixel circuit has a short-circuit defect between the source, drain, and gate, the pixel including the transistor with the short-circuit defect becomes a bright spot pixel or a black dot pixel at the moment when power supply voltage is applied to the drain of the drive transistor or at the moment when a predetermined voltage is applied to surrounding transistors connected to the gate of the drive transistor in the state where power supply voltage is applied to the drain of the drive transistor. However, detecting a pixel that becomes defective over time due to a transistor having a minute leakage current flowing would be difficult at the aforementioned moment. In contrast, according to the present aspect, it is possible to precisely inspect for a leak-defective pixel which does not become a bright spot pixel at the aforementioned time but could become a bright spot pixel after the elapse of a period greater than or equal to one frame.

Furthermore, the switch transistor may include (i) a selection transistor 404 having a source and a drain, one of which is connected to the gate of the drive transistor 401 and the other of which is connected to a data line 434 that transmits the signal voltage, and (ii) a reference transistor 406 having a source and a drain, one of which is connected to the gate of the drive transistor 401 and the other of which is connected to a reference power supply line for detecting the threshold voltage, in S20, the power supply voltage $V_{TFT}$ may be applied to the drain of the drive transistor 401 in a state where the selection transistor 404 and the reference transistor 406 are placed in a non-conducting state and the data line voltage $V_{DA}$ is set to a voltage with which the organic EL element 402 does not emit light, and in S40, the drive transistor 401 included in the pixel 400 having the organic EL element 402 that does not emit light when the power supply voltage $V_{TFT}$ is applied to the drain of the drive transistor 401 and emits light after the elapse of the predetermined period, may be determined as being defective with the current leak.

Accordingly, it is possible to precisely inspect for a drive transistor 401 that changes over time due to a minute leakage current. Therefore, it is possible to prevent a display panel 4 having a pixel 400 that could become bright spot-defective or black dot-defective after shipment from being released into circulation.

Furthermore, in S20, the selection transistor 404 may be placed in a conducting state by applying the inspecting voltage to the gate of the selection transistor 404 in a state where the power supply voltage $V_{TFT}$ is applied to the drain of the drive transistor and the voltage of the data line 434 is set to a voltage with which the organic EL element 402 does not emit light, and in S40, the selection transistor 404 included in the pixel 400 having the organic EL element 402 that does not emit light when the inspecting voltage is applied to the gate of the selection transistor 404 and emits light after the elapse of the predetermined period from when the inspecting voltage is applied, may be determined as being defective with the current leak occurring between the source and the gate or between the drain and the gate.

Accordingly, it is possible to precisely inspect for a selection transistor 404 that changes over time due to a minute leakage current. Therefore, it is possible to prevent a display panel 4 having a pixel 400 that could become bright spot-defective or black dot-defective after shipment from being released into circulation.

Furthermore, in S20, the selection transistor 404 may be intermittently placed in the conducting state by continuously applying a pulse signal, as the inspecting voltage, to the gate of the selection transistor 404, the pulse signal having, as a pulse width, a period that is at least double one horizontal scanning period in row-by-row scanning.

Accordingly, when there is a contact defect configuration between the gate and source of the selection transistor 404, current does not flow from the gate of the selection transistor 404 to the data line 434, and what is called a peak rectified current flows to the holding capacitor element 403 from the gate of the selection transistor 404, via the source of the selection transistor 404. At this time, the gate voltage of the drive transistor 401 rises over time. Then, after the elapse of the predetermined period, the gate-source voltage of the drive transistor 401 becomes a voltage larger than the threshold voltage Vth, and the organic EL element 402 starts to emit light. Therefore, it is possible to precisely inspect for a selection transistor 404 that changes over time due to a minute leakage current.

Furthermore, in S20, the reference transistor 406 may be placed in a conducting state by applying the inspecting voltage to the gate of the reference transistor 406 in a state where the power supply voltage $V_{TFT}$ is applied to the drain of the drive transistor 401, and in S40, the reference transistor 406 included in the pixel 400 having the organic EL element 402 that does not emit light when the inspecting voltage is applied to the gate of the reference transistor 406 and emits light after the elapse of the predetermined period from when the inspecting voltage is applied, may be determined as being defective with the current leak occurring between the source and the gate or between the drain and the gate.

Accordingly, it is possible to precisely inspect for a reference transistor 406 that changes over time due to a minute leakage current. Therefore, it is possible to prevent a display panel 4 having a pixel 400 that could become bright spot-defective or black dot-defective after shipment from being released into circulation.

Furthermore, in S20, the reference transistor 406 may be intermittently placed in the conducting state by continuously applying a pulse signal, as the inspecting voltage, to the gate of the reference transistor 406, the pulse signal having, as a pulse width, a period that is at least double one horizontal scanning period in row-by-row scanning.

Accordingly, when there is a contact defect configuration between the gate and source of the reference transistor 406, current does not flow from the gate of the reference transistor 406 to the reference power supply line, and what is called a peak rectified current flows to the holding capacitor element 403 from the gate of the reference transistor 406, via the source of the reference transistor 406. At this time, the gate voltage of the drive transistor 401 rises over time. Then, after the elapse of the predetermined period, the gate-source voltage of the drive transistor 401 becomes a voltage larger than the threshold voltage Vth, and the organic EL element 402 starts to emit light. Accordingly, it is possible to precisely inspect for a reference transistor 406 that changes over time due to a minute leakage current.

Furthermore, in S20, the voltage of the data line 434 may be set to the inspecting voltage in a state where the selection transistor 404 and the reference transistor 406 are placed in a non-conducting state and the power supply voltage $V_{TFT}$ is applied to the drain of the drive transistor, and in S40, the selection transistor 404 included in the pixel 400 having the organic EL element 402 that does not emit light at the moment when the voltage of the data line 434 is set to the inspecting voltage and emits light after the elapse of the predetermined period from the moment, may be determined as being defective with the current leak occurring between the source and the drain.

Accordingly, it is possible to precisely inspect for a selection transistor 404 that changes over time due to a minute leakage current. Therefore, it is possible to prevent a display panel 4 having a pixel that could become bright spot-defective or black dot-defective after shipment from being released into circulation.

Furthermore, in S20, the voltage of the reference power supply line is set to the inspecting voltage in a state where the selection transistor 404 and the reference transistor 406 are placed in a non-conducting state and the power supply voltage $V_{TFT}$ is applied to the drain of the drive transistor 401, and in S40, the reference transistor 406 included in the pixel 400 having the organic EL element 402 that does not emit light at the moment when the voltage of the reference power supply line is set to the inspecting voltage and emits light after the elapse of the predetermined period from the moment, may be determined as being defective with the current leak occurring between the source and the drain.

Accordingly, it is possible to precisely inspect for a reference transistor 406 that changes over time due to a minute leakage current. Therefore, it is possible to prevent a display panel 4 having a pixel that could become bright spot-defective or black dot-defective after shipment from being released into circulation.

Furthermore, a display panel fabrication method according to an aspect of the present disclosure includes: forming, above a substrate, a drive transistor 401, an organic EL element 402, and a switch transistor having a source connected to the drive transistor 401; and any of the above-described methods of inspecting the display panel 4.

Accordingly, in the fabricating stage, it is possible to precisely inspect for a transistor that changes over time due to a minute leakage current. Therefore, it is possible to prevent a display panel 4 having a pixel that could become bright spot-defective or black dot-defective after shipment from being released into circulation.

Other Embodiments

Although embodiments have been described thus far, the display panel inspecting method and the display panel fabricating method according to the present invention are not limited to the foregoing embodiments. Modifications obtained by applying various modifications to the foregoing embodiment that can be conceived by a person of skill in the art which are within the scope of the essence of the present invention as well as display panels fabricated using the display panel fabricating method according to the embodiment are included in the present invention.

Furthermore, although examples of the pixel circuit configuration included in the display panel 4 in the present disclosure is given in the foregoing embodiments, the circuit configuration of pixel 400 is not limited to such circuit configurations. For example, although a configuration in which the enable transistor 405, the drive transistor 401, and the organic EL element 402 are arranged in this order between the positive power supply line and the negative power supply line is given as and example in Embodiments 1 to 3, these three elements may be arranged in a different order. Specifically, in the display panel 4 in this disclosure, the drive transistor may be of the n-type or the p-type, and the display panel 4 is not limited by the arrangement order of the drive transistor 401 and the organic EL element 402 as long as the drain and source of the drive transistor 401 and the anode and cathode of the organic EL element 402 are disposed on the current path between the positive power supply line and the negative power supply line.

Furthermore, in Embodiments 1 to 3, the selection transistor 404, the enable transistor 405, the reference transistor 406, and the initialization transistor 407 may all be of the n-type or the p-type, or may be a combination of both.

Furthermore, although the display panel inspecting methods and fabrication methods according to Embodiments 1 to 3 are exemplified using cases of inspecting the display panel 4 using the organic EL elements 402, they may be applied as inspecting methods and fabricating methods for a display panel 4 that uses light-emitting elements other than organic EL elements.

Figure 27:
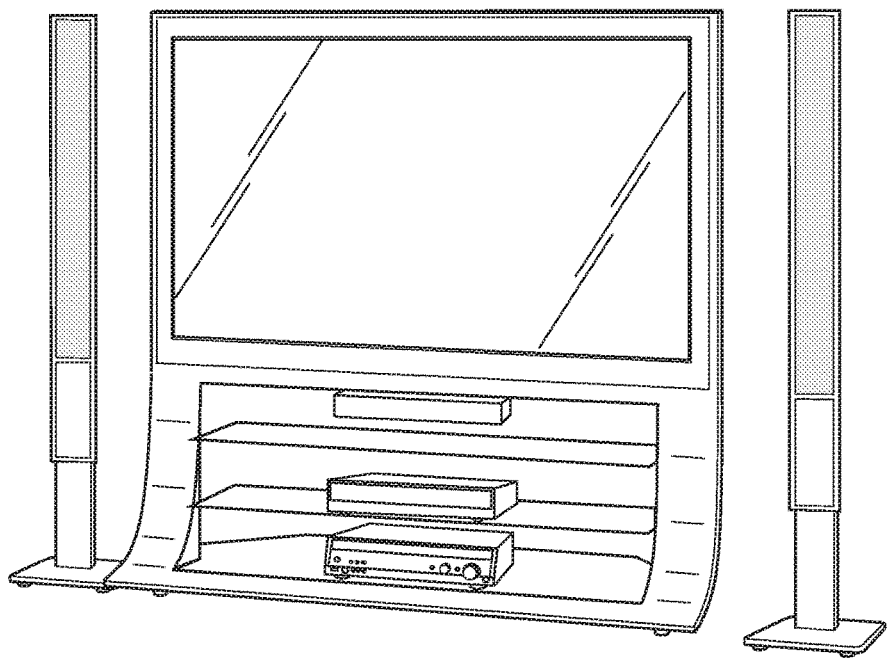
FIG. 27 is an external view of a thin flat-screen TV manufactured using a display panel inspecting method according to an embodiment.

Furthermore, the display panel 4 fabricated according to the display panel fabricating method according to the foregoing embodiments is provided inside a thin flat-screen TV such as that illustrated in FIG. 27. The display panel inspecting method and the display panel fabricating method according to the foregoing embodiments realize high-quality thin flat-screen TVs obtained by preventing the circulation of pixels that could become bright spot-defective or black dot-defective after shipment.

INDUSTRIAL APPLICABILITY

The present invention is particularly useful for organic EL flat panel displays equipped with an organic EL display device, and is ideal for use as an apparatus and method of inspecting a display for which image uniformity is required.

The invention claimed is:

1. A display panel inspecting method for inspecting a display panel in which pixels are arranged in rows and columns,
   the pixels each including
   a drive transistor that passes a drive current when a signal voltage reflecting an image signal is applied to a gate of the drive transistor, the drive current corresponding to the signal voltage;
   a light-emitting element that emits light when the drive current flows through the light-emitting element, the light having a brightness corresponding to the drive current; and
   at least one switching transistor having a source and a drain, the drain is connected to the gate of the drive transistor,
   the display panel inspecting method comprising:
   (A) applying an initialization voltage across the gate and a source of the drive transistor, the initialization voltage being less than or equal to a threshold voltage of the drive transistor;
   (B) applying a power supply voltage for generating the drive current to one of the source and a drain of the drive transistor in a state where the initialization voltage is applied across the gate and the source of the drive transistor, or applying an inspecting voltage to the other of the source and the drain of the switch transistor or the gate of the switch transistor, the inspecting voltage, when applied to the gate of the drive transistor, causing a gate-source voltage of the drive transistor to be greater than or equal to the threshold voltage; and
   (C) determining, as being a defective pixel with a current leak, a pixel, among the pixels, which has the light-emitting element that does not emit light at a moment when (B) is executed and emits light after an elapse of a predetermined period from the moment,
   wherein the predetermined period is a period that is longer than one frame period.

2. The display panel inspecting method according to claim 1,
   wherein the predetermined period is longer than one frame period in which all of the pixels are scanned.

3. The display panel inspecting method according to claim 1,
   wherein the at least one switching transistor includes (i) a selection transistor having a source and a drain, the drain is connected to the gate of the drive transistor and the source is connected to a data line that transmits the signal voltage, and (ii) a reference transistor having a source and a drain, the drain is connected to the gate of the drive transistor and the source is connected to a reference power supply line for detecting the threshold voltage,
   in (B), the power supply voltage is applied to the one of the source and the drain of the drive transistor in a state where the selection transistor and the reference transistor are placed in a non-conducting state and a voltage of the data line is set to a voltage with which the light-emitting element does not emit light, and
   in (C), the drive transistor included in the pixel having the light-emitting element that does not emit light when the power supply voltage is applied to the one of the source and the drain of the drive transistor and emits light after the elapse of the predetermined period from when the power supply voltage is applied, is determined as being defective with the current leak.

4. The display panel inspecting method according to claim 1,
wherein the switch transistor includes a selection transistor having a source and a drain, one of which is connected to the gate of the drive transistor and the other of which is connected to a data line that transmits the signal voltage,
in (B), the selection transistor is placed in a conducting state by applying the inspecting voltage to the gate of the selection transistor in a state where the power supply voltage is applied to the one of the source or the drain of the drive transistor and a voltage of the data line is set to a voltage with which the light-emitting element does not emit light, and
in (C), the selection transistor included in the pixel having the light-emitting element that does not emit light when the inspecting voltage is applied to the gate of the selection transistor and emits light after the elapse of the predetermined period from when the inspecting voltage is applied, is determined as being defective with the current leak occurring between the source and the gate or between the drain and the gate.

5. The display panel inspecting method according to claim 4,
wherein in (B), the selection transistor is intermittently placed in the conducting state by continuously applying a pulse signal, as the inspecting voltage, to a gate of the selection transistor, the pulse signal having, as a pulse width, a period that is at least double one horizontal scanning period in row-by-row scanning.

6. The display panel inspecting method according to claim 1,
wherein the at least one switching transistor includes a reference transistor having a source and a drain, the drain is connected to the gate of the drive transistor and the source is connected to a reference power supply line different from a data line that transmits the signal voltage,
in (B), the reference transistor is placed in a conducting state by applying the inspecting voltage to a gate of the reference transistor in a state where the power supply voltage is applied to the one of the source or the drain of the drive transistor, and
in (C), the reference transistor included in the pixel having the light-emitting element that does not emit light when the inspecting voltage is applied to the gate of the reference transistor and emits light after the elapse of the predetermined period from when the inspecting voltage is applied, is determined as being defective with the current leak occurring between the source and the gate or between the drain and the gate.

7. The display panel inspecting method according to claim 6,
wherein in (B), the reference transistor is intermittently placed in the conducting state by continuously applying a pulse signal, as the inspecting voltage, to a gate of the reference transistor, the pulse signal having, as a pulse width, a period that is at least double one horizontal scanning period in row-by-row scanning.

8. The display panel inspecting method according to claim 1,
wherein the at least one switching transistor includes (i) a selection transistor having a source and a drain, the drain is connected to the gate of the drive transistor and the source is connected to a data line that transmits the signal voltage, and (ii) a reference transistor having a source and a drain, the drain is connected to the gate of the drive transistor and the source is connected to a reference power supply line for detecting the threshold voltage,
in (B), a voltage of the data line is set to the inspecting voltage in a state where the selection transistor and the reference transistor are placed in a non-conducting state and the power supply voltage is applied to the one of the source and the drain of the drive transistor, and
in (C), the selection transistor included in the pixel having the light-emitting element that does not emit light at a moment when the voltage of the data line is set to the inspecting voltage and emits light after the elapse of the predetermined period from the moment, is determined as being defective with the current leak occurring between the source and the drain.

9. The display panel inspecting method according to claim 1,
wherein the at least one switching transistor includes (i) a selection transistor having a source and a drain, the drain is connected to the gate of the drive transistor and the source is connected to a data line that transmits the signal voltage, and (ii) a reference transistor having a source and a drain, the drain is connected to the gate of the drive transistor and the source is connected to a reference power supply line for detecting the threshold voltage,
in (B), a voltage of the reference power supply line is set to the inspecting voltage in a state where the selection transistor and the reference transistor are placed in a non-conducting state and the power supply voltage is applied to the one of the source and the drain of the drive transistor, and
in (C), the reference transistor included in the pixel having the light-emitting element that does not emit light at a moment when the voltage of the reference power supply line is set to the inspecting voltage and emits light after the elapse of the predetermined period from the moment, is determined as being defective with the current leak occurring between the source and the drain.

10. A display panel fabricating method comprising:
forming, above a substrate:
a drive transistor that passes a drive current to a source and a drain when a signal voltage reflecting an image signal is applied to a gate of the drive transistor, the drive current corresponding to the signal voltage;
a light-emitting element that emits light when the drive current flows to the light-emitting element, the light having a brightness corresponding to the drive current; and
at least one switching transistor having one of a source and a drain, wherein the drain is connected to the gate of the drive transistor; and
the display panel inspecting method according to claim 1.

* * * * *